US012672424B2

(12) United States Patent
Fang et al.

(10) Patent No.: US 12,672,424 B2
(45) Date of Patent: Jun. 30, 2026

(54) SENSOR EMBEDDED DISPLAY PANEL AND ELECTRONIC DEVICE

(71) Applicant: Samsung Electronics Co., Ltd., Suwon-si (KR)

(72) Inventors: Feifei Fang, Suwon-si (KR); Sungyoung Yun, Suwon-si (KR); Chul Joon Heo, Suwon-si (KR); Hyeong-Ju Kim, Suwon-si (KR); Kyung Bae Park, Suwon-si (KR); Hwijoung Seo, Suwon-si (KR); Tae Jin Choi, Suwon-si (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 297 days.

(21) Appl. No.: 18/459,942

(22) Filed: Sep. 1, 2023

(65) Prior Publication Data

US 2024/0196635 A1 Jun. 13, 2024

(30) Foreign Application Priority Data

Nov. 24, 2022 (KR) ........................ 10-2022-0159500

(51) Int. Cl.
*H10K 39/34* (2026.01)
*G06V 40/13* (2022.01)
(Continued)

(52) U.S. Cl.
CPC ......... *H10K 39/34* (2023.02); *G06V 40/1318* (2022.01); *H10K 59/353* (2023.02); *H10K 2101/40* (2023.02)

(58) Field of Classification Search
CPC .. H10K 39/34; H10K 59/353; H10K 2101/40; H10K 85/621; H10K 2101/30;
(Continued)

(56) References Cited

U.S. PATENT DOCUMENTS 7,126,267 B2 10/2006 Liao et al.
7,196,366 B2 3/2007 Forrest et al.
(Continued)

FOREIGN PATENT DOCUMENTS

CN 111883665 A 11/2020
CN 109994624 B 12/2020
(Continued)

OTHER PUBLICATIONS

Extended European Search Report dated Apr. 9, 2024 for corresponding European Application No. 23209039.9.
(Continued)

*Primary Examiner* — Duy T Nguyen
(74) *Attorney, Agent, or Firm* — HARNESS, DICKEY & PIERCE, P.L.C.

(57) ABSTRACT

A sensor-embedded display panel includes a light emitting element and a sensor which include separate portions of a first common auxiliary layer including a hole transport material and a second common auxiliary layer including an electron transport material. The sensor includes first and second semiconductor layers proximate to the first and second common auxiliary layers, respectively, and including a p-type semiconductor and a non-fullerene n-type semiconductor having a LUMO energy level deeper than that of the electron transport material, respectively. An insertion layer between the second semiconductor layer and the second common auxiliary layer includes a metal, a metal compound, or any combination thereof. A work function of the metal or a LUMO energy level of the metal compound is deeper or shallower than the LUMO energy level of the non-fullerene n-type semiconductor and the LUMO energy level of the electron transport material within less than about 1.3 eV, respectively.

20 Claims, 4 Drawing Sheets

(51) Int. Cl.
*H10K 59/35* (2023.01)
*H10K 101/40* (2023.01)

(58) Field of Classification Search
CPC ...... H10K 30/85; H10K 39/501; H10K 65/00; H10K 59/352; H10K 30/20; H10K 30/60; H10K 30/80; H10K 30/81; H10K 59/12; H10K 59/35; H10K 59/00; H10K 50/11; H10K 50/15; H10K 50/16; H10K 50/82; G06V 40/1318; G06V 40/45
USPC ........................................................... 257/40
See application file for complete search history.

(56) References Cited

U.S. PATENT DOCUMENTS

| | | | | |
|---|---|---|---|---|
| 7,638,356 | B2 | 12/2009 | Yang et al. | |
| 7,816,715 | B2 | 10/2010 | Forrest et al. | |
| 10,522,584 | B2 | 12/2019 | Cheng et al. | |
| 10,697,828 | B2 | 6/2020 | Kim et al. | |
| 11,121,196 | B2 | 9/2021 | Lee et al. | |
| 12,193,276 | B2 | 1/2025 | Choi et al. | |
| 2009/0141004 | A1* | 6/2009 | Yamazaki | G06F 3/0412 345/204 |
| 2018/0158877 | A1* | 6/2018 | Zeng | G06V 10/147 |
| 2020/0111851 | A1* | 4/2020 | Park | H10K 59/805 |
| 2021/0327979 | A1* | 10/2021 | Kamada | H05B 33/02 |
| 2022/0100982 | A1 | 3/2022 | Yao et al. | |
| 2022/0261584 | A1* | 8/2022 | Heo | H10K 50/15 |
| 2022/0359628 | A1* | 11/2022 | Choi | G06F 3/0421 |
| 2022/0367570 | A1* | 11/2022 | Kim | C07D 471/14 |

FOREIGN PATENT DOCUMENTS

| | | | |
|---|---|---|---|
| CN | 115312567 | A | 11/2022 |
| KR | 10-2007-0058485 | A | 6/2007 |
| KR | 10-2009-0034970 | A | 4/2009 |
| KR | 10-2020-0080484 | A | 7/2020 |
| KR | 10-2022-0147027 | A | 11/2022 |
| KR | 10-2022-0152591 | A | 11/2022 |
| WO | 2022/162494 | A1 | 8/2022 |

OTHER PUBLICATIONS

Korean Office Action dated May 14, 2026 for corresponding Korean Patent Application No. 10-2022-0159500 and English-language translation thereof.

* cited by examiner

SENSOR EMBEDDED DISPLAY PANEL AND ELECTRONIC DEVICE

CROSS-REFERENCE TO RELATED APPLICATION

This application claims priority to and the benefit of Korean Patent Application No. 10-2022-0159500 filed in the Korean Intellectual Property Office on Nov. 24, 2022, the entire contents of which are incorporated herein by reference.

BACKGROUND

1. Field

Example embodiments are directed to sensor-embedded display panels and electronic devices including same.

2. Description of the Related Art

Recently, there is an increasing demand for a display device implementing a biometric recognition technology that authenticates the person by extracting specific biometric information or behavioral characteristic information of a person with an automated device centering on finance, healthcare, and mobile. Accordingly, the display device may include a sensor for biometric recognition.

SUMMARY

Such a sensor for biometric recognition may be divided into an electrostatic type, an ultrasonic type, or an optical type. Among such types of sensors, the optical type sensor is a sensor configured to absorb light and convert the absorbed light into an electrical signal. The organic material has a large extinction coefficient and may be configured to selectively absorb light in a specific wavelength region according to a molecular structure, and thus it may be usefully applied to an optical type sensor.

On the other hand, the sensor provided in the display device may be disposed under the display panel or may be manufactured as a separate module and mounted on the outside of the display panel. However, when the sensor is disposed under the display panel, the object should be recognized through the display panel, various films, and/or parts, and thus performance may be degraded. When the sensor is manufactured and mounted as a separate module, there are limitations in terms of design and usability. Accordingly, an approach to embed a sensor in the display panel may be considered. However, since the performance and physical properties required for the display panel and the sensor are different from each other, it may be difficult to implement in an integrated form.

Some example embodiments provide a sensor-embedded display panel including a sensor capable of improving performance by being integrated with the display panel.

Some example embodiments provide an electronic device including the sensor-embedded display panel.

According to some example embodiments, a sensor-embedded display panel may include a light emitting element on a substrate and including a light emitting layer, and a sensor on the substrate and including a photosensitive layer arranged in parallel with the light emitting layer along an in-plane direction of the substrate. The light emitting element and the sensor may include separate, respective portions of a first common auxiliary layer connected to each other to extend continuously under the light emitting layer and the photosensitive layer, the first common auxiliary layer including a hole transport material, and separate, respective portions of a second common auxiliary layer connected to each other to extend continuously on the light emitting layer and the photosensitive layer, the second common auxiliary layer including an electron transport material. The photosensitive layer may include a first semiconductor layer that is proximate to the first common auxiliary layer in relation to the second common auxiliary layer and includes a p-type semiconductor, and a second semiconductor layer that is proximate to the second common auxiliary layer in relation to the first common auxiliary layer and includes a non-fullerene n-type semiconductor, a LUMO energy level of the non-fullerene n-type semiconductor being deeper than a LUMO energy level of the electron transport material. The sensor may further include an insertion layer between the second semiconductor layer and the second common auxiliary layer and including a metal, a metal compound, or any combination thereof. A work function of the metal or a LUMO energy level of the metal compound may be deeper or shallower than each of the LUMO energy level of the non-fullerene n-type semiconductor and the LUMO energy level of the electron transport material within less than about 1.3 eV, respectively.

The insertion layer may have a thickness of about 0.5 nm to about 12 nm.

The work function of the metal or the LUMO energy level of the metal compound may be about 2.8 eV to about 4.2 eV.

The metal may include lanthanides, aluminum (Al), calcium (Ca), potassium (K), magnesium (Mg), an alloy thereof, or any combination thereof, and the metal compound may include an oxide or a sulfide containing at least one of titanium (Ti), tin (Sn), magnesium (Mg), zinc (Zn), or zirconium (Zr).

An upper surface of the insertion layer facing the second common auxiliary layer may have an uneven surface.

The LUMO energy level of the non-fullerene n-type semiconductor may be deeper than the LUMO energy level of the electron transport material within greater than or equal to about 0.01 eV and less than or equal to about 1.0 eV.

The LUMO energy level of the non-fullerene n-type semiconductor may be greater than about 2.9 eV and less than or equal to about 3.8 eV, and an energy bandgap of the non-fullerene n-type semiconductor may be about 2.5 eV to about 4.0 eV.

The LUMO energy level of the non-fullerene n-type semiconductor may be greater than about 2.9 eV and less than or equal to about 3.8 eV, and the LUMO energy level of the electron transport material may be about 2.9 eV to about 3.3 eV.

The LUMO energy level of the non-fullerene n-type semiconductor may be about 3.0 eV to about 3.5 eV, the work function of the metal or the LUMO energy level of the metal compound may be about 2.9 eV to about 4.0 eV, and the LUMO energy level of the electron transport material may be between about 2.9 eV to about 3.2 eV.

The second common auxiliary layer may be included in both the light emitting element and the sensor, and the insertion layer may be only included in the sensor and not included in the light emitting element.

The light emitting layer may include at least one organic light emitting material, and a LUMO energy level of the organic light emitting material may be shallower than the LUMO energy level of the electron transport material.

A difference in sublimation temperatures among the p-type semiconductor, the non-fullerene n-type semiconductor, and the at least one organic light emitting material may be greater than or equal to about 0° C. and less than about 150° C., wherein the sublimation temperature may be a temperature at which a weight loss of 10% compared to an initial weight occurs during thermogravimetric analysis at 10 Pa or less.

The light emitting element and the sensor may further include a common electrode on the second common auxiliary layer and configured to apply a common voltage to both the light emitting element and the sensor.

The light emitting element may include a first light emitting element configured to emit light of a red wavelength spectrum, a second light emitting element configured to emit light of a green wavelength spectrum, and a third light emitting element configured to emit light of a blue emission spectrum, the sensor may be between at least two of the first light emitting element, the second light emitting element, or the third light emitting element, and the sensor may be configured to absorb light emitted from at least one of the first, second, or third light emitting elements and then reflected by a recognition target, and may be configured to convert the absorbed light into an electrical signal.

The p-type semiconductor may be a light absorbing organic semiconductor configured to absorb light in a portion of a visible light wavelength spectrum, and the non-fullerene n-type semiconductor may be a transparent organic semiconductor.

According to some example embodiments, a sensor-embedded display panel may include a display area configured to display a color and a non-display area other than the display area. The display area may include a first subpixel configured to display a first color and including a first light emitting element, a second subpixel configured to display a second color and including a second light emitting element, and a third subpixel configured to display a third color and including a third light emitting element. The non-display area may include a sensor between at least two of the first subpixel, the second subpixel, or the third subpixel. The sensor may include a first electrode, a first common auxiliary layer on the first electrode and including a hole transport material, a first semiconductor layer on the first common auxiliary layer and including a p-type semiconductor, a second semiconductor layer on the first semiconductor layer and including a non-fullerene n-type semiconductor, an insertion layer on the second semiconductor layer and including a metal, a metal compound, or any combination thereof, a second common auxiliary layer on the insertion layer and including an electron transport material, and a second electrode, wherein a work function of the metal or a LUMO energy level of the metal compound is deeper or shallower than each of a LUMO energy level of the non-fullerene n-type semiconductor and a LUMO energy level of the electron transport material within less than about 1.3 eV, respectively.

A thickness of the insertion layer may be about 0.5 nm to about 12 nm, and the work function of the metal or the LUMO energy level of the metal compound may be about 2.8 eV to about 4.2 eV.

The metal may include lanthanides, aluminum (Al), calcium (Ca), potassium (K), magnesium (Mg), an alloy thereof, or any combination thereof, and the metal compound may include an oxide or a sulfide containing at least one of titanium (Ti), tin (Sn), magnesium (Mg), zinc (Zn), or zirconium (Zr).

The p-type semiconductor may be an organic light absorbing semiconductor configured to absorb light of a wavelength spectrum corresponding to any one of the first color, the second color, or the third color, and the non-fullerene n-type semiconductor may be a transparent organic semiconductor having a LUMO energy level of greater than about 2.9 eV and less than or equal to about 3.8 eV.

According to some example embodiments, an electronic device including the sensor-embedded display panel is provided.

A sensor capable of improving performance by being integrated with a display panel is provided.

DETAILED DESCRIPTION

Figure 1:
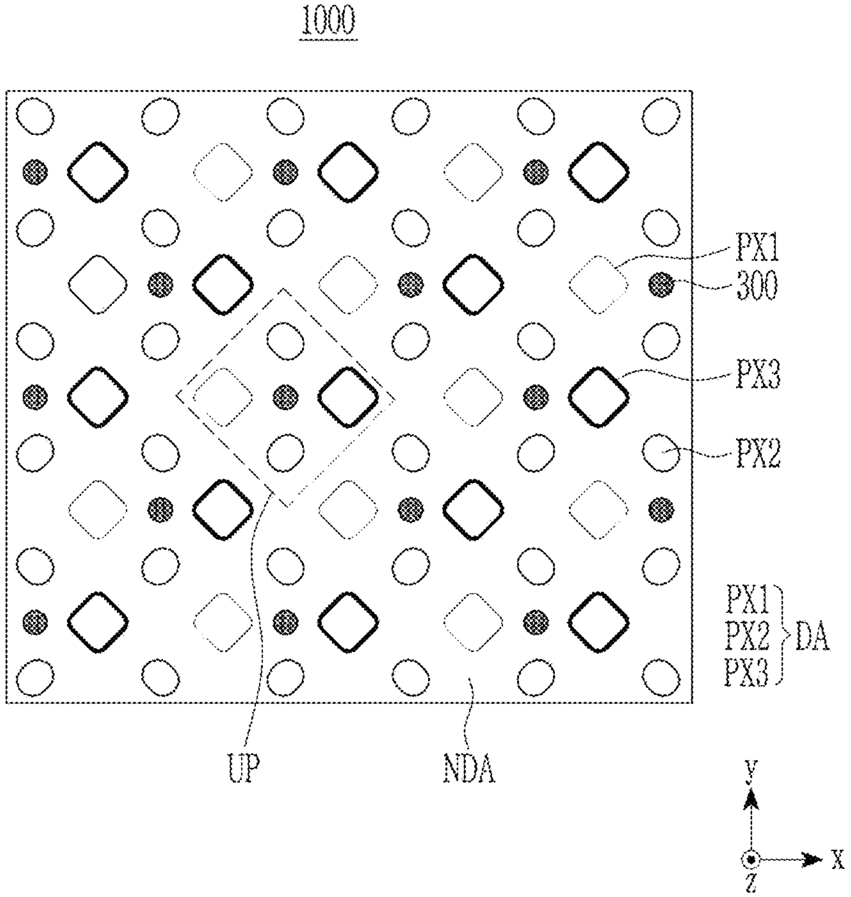
FIG. 1 is a plan view illustrating an example of a display panel with a built-in sensor according to some example embodiments.

Hereinafter, some example embodiments will be described in detail so that a person skilled in the art would understand the same. However, a structure that is actually applied may be implemented in various different forms and is not limited to the example embodiments described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, the terms "lower" and "upper" are used for better understanding and ease of description, but do not limit the location relationship.

Hereinafter, when a definition is not otherwise provided, the energy level is the highest occupied molecular orbital (HOMO) energy level or the lowest unoccupied molecular orbital (LUMO) energy level.

Hereinafter, when a definition is not otherwise provided, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level. Further, the differences between the work function and/or the energy level may be values obtained by subtracting a small value of the absolute value from a large value of the absolute value.

Hereinafter, when a definition is not otherwise provided, the HOMO energy level may be evaluated with an amount of photoelectrons emitted by energy when irradiating UV light to a thin film using AC-2 (Hitachi) or AC-3 (Riken Keiki Co., Ltd.).

Hereinafter, when a definition is not otherwise provided, the LUMO energy level may be obtained by obtaining an energy bandgap using a UV-Vis spectrometer (Shimadzu Corporation), and then calculating the LUMO energy level from the energy bandgap and the already measured HOMO energy level.

It will further be understood that when an element is referred to as being "on" another element, it may be above or beneath or adjacent (e.g., horizontally adjacent) to the other element. It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof. Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%). Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%). Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of +15%). It will be understood that elements and/or properties thereof may be recited herein as being "identical" to, "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%). When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the inventive concepts. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, a sensor-embedded display panel according to some example embodiments is described.

The sensor-embedded display panel according to some example embodiments may be capable of performing a display function and a recognition function (e.g., biometric recognition function), and may be an in-cell type display panel in which a sensor performing a recognition function (e.g., biometric recognition function) is embedded in the display panel.

Figure 2:
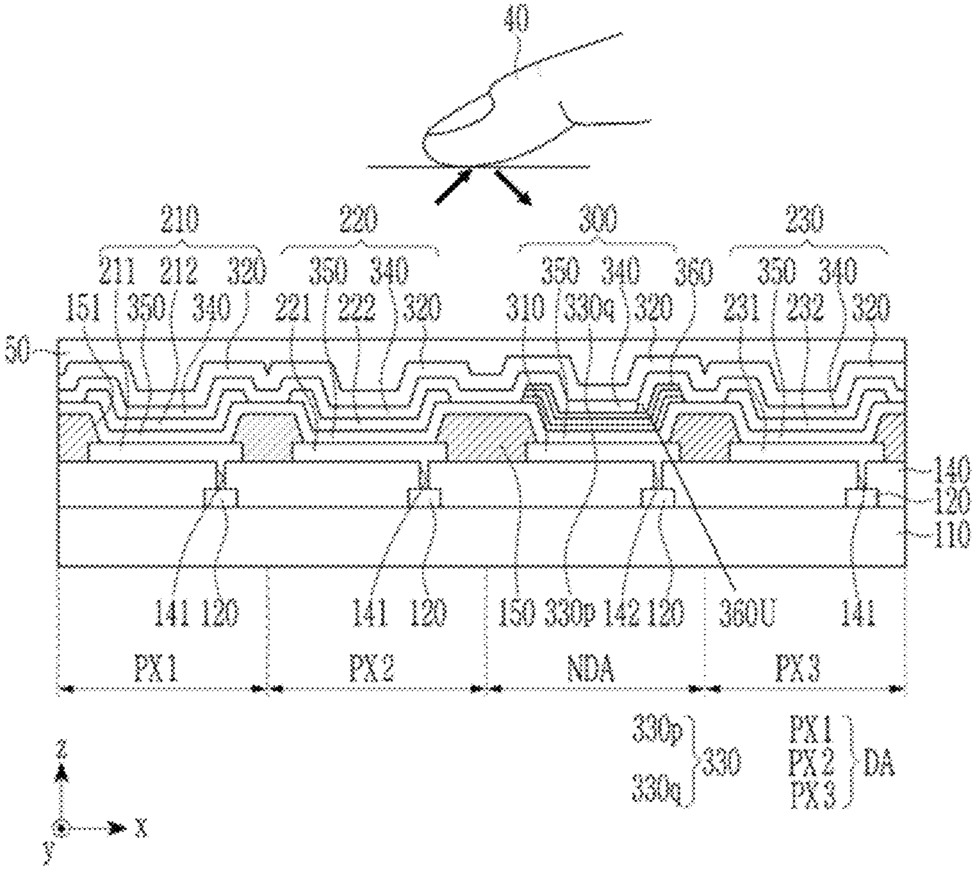
FIG. 2 is a cross-sectional view showing an example of a display panel with a built-in sensor according to some example embodiments.

FIG. 1 is a plan view showing an example of a sensor-embedded display panel according to some example embodiments, and FIG. 2 is a cross-sectional view illustrating an example of a sensor-embedded display panel according to some example embodiments.

Referring to FIGS. 1 and 2, a sensor-embedded display panel 1000 according to some example embodiments includes a plurality of subpixels PXs configured to display different colors. The plurality of subpixels PXs may be configured to display at least three primary colors, for example, a first subpixel PX1, a second subpixel PX2, and a third subpixel PX3 displaying different first color, second color, and third color selected from red, green, and blue. For example, the first color, the second color, and the third color may be red, green, and blue, respectively. The first subpixel PX1 may be a red subpixel displaying red, the second subpixel PX2 may be a green subpixel displaying green, and the third subpixel PX3 may be a blue subpixel displaying blue. However, the present inventive concepts are not limited thereto, and an auxiliary subpixel (not shown) such as a white subpixel may be further included. Displaying a color may refer to emitting light corresponding to the color (e.g., light in a wavelength spectrum of the color). Referring to FIG. 1, the sensor-embedded display panel 1000 may include a plurality of first subpixels PX1 configured to display a red color (e.g., light of a red wavelength spectrum) and including a first light emitting element (e.g., the first light emitting element 210 shown in FIG. 2), a plurality of second subpixels PX2 configured to display a green color (e.g., light of a green wavelength spectrum) and including a second light emitting element (e.g., the second light emitting element 220 shown in FIG. 2), and a plurality of third subpixels PX3 configured to display a blue color (e.g., light of a blue wavelength spectrum) and including a third light emitting element (e.g., the third light emitting element 230 shown in FIG. 2), where the first subpixels PX1, the second subpixels PX2, and the third subpixels PX3 are located in and/or at least partially define the display area (DA).

The plurality of subpixels PXs including the first subpixel PX1, the second subpixel PX2, and the third subpixel PX3 may constitute (e.g., define) one unit pixel UP to be arranged repeatedly along the row and/or column. In FIG. 1, a structure including one first subpixel PX1, two second subpixels PX2, and one third subpixel PX3 in the unit pixel UP is illustrated, but the present inventive concepts are not limited thereto. At least one first subpixel PX1, at least one second subpixel PX2, and at least one third subpixel PX3 may be included in the unit pixel UP. In the drawing, as an example, an arrangement of a Pentile type is illustrated, but the present inventive concepts is not limited thereto. The subpixels PXs may be arranged variously. An area occupied by the plurality of subpixels PXs and displaying colors by the plurality of subpixels PXs may be a display area DA displaying an image. For example, the area (e.g., in the xy plane) of the subpixels (PX) may collectively define the display area (DA) that is configured to display an image thereon (e.g., configured to display one or more colors). A portion of the area (e.g., in the xy plane) of the sensor-embedded display panel 1000 that excludes the display area (DA) (e.g., portions of the area of the sensor-embedded display panel 1000 that are between adjacent subpixels (PX) in the xy direction, xy plane, etc.) may be a non-display area (NDA) that is configured to not display an image thereon (e.g., configured to not display any color).

Each of the first subpixel PX1, the second subpixel PX2, and the third subpixel PX3 may include a light emitting element. As an example, the first subpixel PX1 may include a first light emitting element 210 configured to emit light of a wavelength spectrum of a first color, the second subpixel PX2 may include a second light emitting element 220 configured to emit light of a wavelength spectrum of a second color, and the third subpixel PX3 may include a third light emitting element 230 configured to emit light of a wavelength spectrum of a third color. However, the present inventive concepts are not limited thereto, and at least one of the first subpixel PX1, the second subpixel PX2, or the third subpixel PX3 may include a light emitting element configured to emit light of a combination of a first color, a second color, and a third color, that is, light in a white wavelength spectrum, and may display a first color, a second color, or a third color through a color filter (not shown). Herein, the terms "wavelength spectrum" and "wavelength region" may be used interchangeably.

The sensor-embedded display panel 1000 according to some example embodiments includes a sensor 300. The sensor 300 may be disposed in a non-display area NDA. The non-display area NDA may be an area other than the display area DA, in which the first subpixel PX1, the second subpixel PX2, the third subpixel PX3, and optionally auxiliary subpixels are not disposed (e.g., a portion of the total area of the sensor-embedded display panel 1000 that excludes the display area (DA), excludes the subpixels (PX), is between adjacent subpixels (PX), etc.). For example, the area (e.g., in the xy plane) of the subpixels (PX) may collectively define the display area (DA) that is configured to display an image thereon (e.g., configured to display one or more colors). A portion of the area (e.g., in the xy plane) of the sensor-embedded display panel 1000 that excludes the display area (DA) (e.g., portions of the area of the sensor-embedded display panel 1000 that are between adjacent subpixels (PX) in the xy direction, xy plane, etc.) may be a non-display area (NDA) that is configured to not display an image thereon (e.g., configured to not display any color). The sensor 300 may be disposed between at least two subpixels selected from the first subpixel PX1, the second subpixel PX2, and the third subpixel PX3 (e.g., between at least two subpixels of a first subpixel PX1 of a plurality of first subpixels PX1, a second subpixel PX2 of the plurality of second subpixels PX2, or a third subpixel PX3 of the plurality of third subpixels PX3), and may be disposed in parallel with the first, second, and third light emitting elements 210, 220, and 230 in the display area DA, for example at last partially in parallel along the in-plane direction of the substrate 110 (e.g., the xy direction as shown), which may be a direction extending parallel to an upper surface of the substrate 110.

The sensor 300 may be an optical type recognition sensor (e.g., a biometric sensor), and may be configured to absorb light emitted from at least one of the first, second or third light emitting elements 210, 220, or 230 in the display area DA and reflected by a recognition target 40 such as a living body, a tool, or an object (e.g., may be configured to absorb light of a red wavelength spectrum, a green wavelength spectrum, a blue wavelength spectrum, an infrared wavelength spectrum, or any combination thereof) to convert it (e.g., the absorbed light) into an electrical signal. Herein, the living body may be a finger, a fingerprint, a palm, an iris, a face, and/or a wrist, but is not limited thereto. The sensor 300 may be, for example, a fingerprint sensor, an illumination sensor, an iris sensor, a distance sensor, a blood vessel distribution sensor, and/or a heart rate sensor, but is not limited thereto.

The sensor 300 may be in the same plane as the first, second, and third light emitting elements 210, 220, and 230 on the substrate 110, and may be embedded in the sensor-embedded display panel 1000. Restated, the sensor 300 may be at least partially in parallel with the first, second, and third light emitting elements 210, 220, and 230 on the substrate 110 along an in-plane direction of the substrate 110. As described herein, the in-plane direction of the substrate 110 may be a direction (e.g., the xy direction as shown) that extends in parallel with at least a portion of the substrate 110, including an upper surface of the substrate 110.

Referring to FIG. 2, the sensor-embedded display panel 1000 includes a substrate 110; a thin film transistor 120 on the substrate 110; an insulation layer 140 on the thin film transistor 120; a pixel definition layer 150 on the insulation layer 140; and first, second, or third light emitting elements 210, 220, or 230 and the sensor 300 in a space partitioned by (e.g., at least partially defined by) the pixel definition layer 150.

The substrate 110 may be a light transmitting substrate, for example, a glass substrate or a polymer substrate. The polymer substrate may include, for example, polycarbonate, polymethylmethacrylate, polyethyleneterephthalate, polyethylenenaphthalate, polyimide, polyamide, polyamideimide, polyethersulfone, polyorganosiloxane, styrene-ethylene-butylene-styrene, polyurethane, polyacrylate, polyolefin, or any combination thereof, but is not limited thereto.

A plurality of thin film transistors 120 are formed on the substrate 110. One or more thin film transistors 120 may be included in each subpixel PX, and may include, for example, at least one switching thin film transistor and/or at least one driving thin film transistor. The substrate 110 on which the thin film transistor 120 is formed may be referred to as a thin film transistor substrate (TFT substrate) or a thin film transistor backplane (TFT backplane).

The insulation layer 140 may cover the substrate 110 and the thin film transistor 120 and may be formed on the whole (e.g., entire) surface of the substrate 110. The insulation layer 140 may be a planarization layer or a passivation layer, and may include an organic insulating material, an inorganic insulating material, an organic-inorganic insulating material, or any combination thereof. The insulation layer 140 may have a plurality of contact holes 141 for connecting the first, second, and third light emitting elements 210, 220, and 230 and the thin film transistor 120 and a plurality of contact holes 142 for electrically connecting the sensor 300 and the thin film transistor 120. The insulation layer 140 may include an inorganic material, an organic material, an organic/inorganic material, or any combination thereof. The inorganic material may be, for example, silicon oxide, silicon nitride, silicon oxynitride, aluminum oxide, or aluminum nitride, the organic material may be, for example, polyimide, polyamide, polyamideimide, or polyacrylate, and the organic/inorganic material may be, for example, polyorganosiloxane, or polyorganosilazane.

The pixel definition layer 150 may also be formed on the whole surface of the substrate 110 and may be between adjacent subpixels PXs to partition each subpixel PX. The pixel definition layer 150 may have a plurality of openings 151 in each subpixel PX, and in each opening 151, any one of first, second, and third light emitting elements 210, 220, or 230 and the sensors 300 may be disposed. The pixel definition layer 150 may include an inorganic material, an organic material, an organic/inorganic material, or any combination thereof. The inorganic material may be, for example, silicon oxide, silicon nitride, silicon oxynitride, aluminum oxide, or aluminum nitride, the organic material may be, for example, polyimide, polyamide, polyamideimide, or polyacrylate, the organic/inorganic material may be, for example, polyorganosiloxane or polyorganosilazane.

The first, second and third light emitting elements 210, 220, and 230 are formed on the substrate 110 (or thin film transistor substrate), and are repeatedly arranged along the in-plane direction (e.g., xy direction) of the substrate 110 (also referred to as an in-plane direction of the substrate 110). As described above, the first, second, and third light emitting elements 210, 220, and 230 may be included in the first subpixel PX1, the second subpixel PX2, and the third subpixel PX3, respectively. The first, second, and third light emitting elements 210, 220, and 230 may be electrically connected to separate thin film transistors 120 and may be driven independently.

The first, second, and third light emitting elements 210, 220, and 230 may be configured to each independently emit one light of a red wavelength spectrum, a green wavelength spectrum, a blue wavelength spectrum, and any combination thereof. For example, the first light emitting element 210 may be configured to emit light of a red wavelength spectrum, the second light emitting element 220 may be configured to emit light of a green wavelength spectrum, and the third light emitting element 230 may be configured to emit light of a blue wavelength spectrum. Herein, the red wavelength spectrum, the green wavelength spectrum, and the blue wavelength spectrum may have a maximum emission wavelength ($\lambda_{peak,L}$) in a wavelength region of greater than about 600 nm and less than about 750 nm, about 500 nm to about 600 nm, and greater than or equal to about 380 nm and less than about 500 nm, respectively.

The first, second, and third light emitting elements 210, 220, and 230 may be, for example, light emitting diodes, for example organic light emitting diodes (OLEDs) including an organic light emitting material.

The sensor 300 may be formed on the substrate 110 (or the thin film transistor substrate), and may be randomly or regularly arranged along the in-plane direction (e.g., xy direction) of the substrate 110. As described above, the sensor 300 may be in the non-display area NDA, and may be connected to a separate thin film transistor 120 to be independently driven. The sensor 300 may be configured to absorb light belonging to a wavelength spectrum of the light emitted from at least one of the first, second, or third light emitting elements 210, 220, or 230 and then convert it into an electrical signal. For example, the sensor 300 may be configured to absorb light of a red wavelength spectrum, a green wavelength spectrum, a blue wavelength spectrum, or any combination thereof, and then convert it into an electrical signal, and for example, light of a green wavelength spectrum may be absorbed and converted into an electrical signal. The sensor 300 may be, for example, a photoelectric conversion diode, for example an organic photoelectric conversion diode including a photoelectric conversion material.

Each of the first, second, and third light emitting elements 210, 220, and 230 and the sensor 300 may include a separate, respective pixel electrode of the pixel electrodes 211, 221, 231, and 310; a separate portion of a common electrode 320 facing the pixel electrodes 211, 221, 231, and 310 and to which a common voltage is applied; a separate, respective light emitting layer 212, 222, and 232 or a photosensitive layer 330; a separate portion of a first common auxiliary layer 350; and a separate portion of a second common auxiliary layer 340 between the pixel electrode 211, 221, 231, and 310 and the common electrode 320.

The first, second, and third light emitting elements 210, 220, and 230 and the sensor 300 may be arranged at least partially in parallel along the in-plane direction (e.g., xy direction) of the substrate 110, and may share the common electrode 320, the first common auxiliary layer 350, and the second common auxiliary layer 340 which are formed on the whole surface of the substrate 110. For example, as shown in at least FIG. 2, the photosensitive layer 330 of the sensor 300 and the light emitting layers 212, 222, and 232 of the first, second, and third light emitting elements 210, 220, and 230 may at least partially overlap with each other (e.g., partially or completely overlap each other) in the in-plane direction (e.g., xy direction) of the substrate 110, which may be understood to be a horizontal direction that extends in parallel to an in-plane direction of the substrate 110 as shown in FIG. 2 and/or a horizontal direction that extends in parallel to an upper surface of the substrate 110 as shown in FIG. 2, and the photosensitive layer 330 and the light emitting layers 212, 222, and 232 may be at least partially positioned on the same plane (e.g., an xy plane extending in the xy directions that intersects each of the photosensitive layer 330 and the light emitting layers 212, 222, and 232).

The common electrode 320 is continuously formed as a single piece of material that extends on the light emitting layers 212, 222, and 232 and the photosensitive layer 330, and is substantially formed on the whole surface of the substrate 110. The common electrode 320 may apply a common voltage to the first, second, and third light emitting elements 210, 220, and 230 and the sensor 300. As shown, the first, second, and third light emitting elements 210, 220, and 230 and the sensor 300 may include separate portions of a single common electrode 320 that is a single piece of material that extends on each of the respective light emitting layers 212, 222, and 232 and the photosensitive layer 330 and between the first, second, and third light emitting elements 210, 220, and 230 and the sensor 300.

The common electrode 320 may be a light transmitting electrode configured to transmit light and may be an incident electrode through which light passes. The light transmitting electrode may be a transparent electrode or a semi-transmissive electrode. The transparent electrode may have a light transmittance of about 85% to about 100%, about 90% to about 100%, or about 95% to about 100%, and the semi-transmissive electrode may have a light transmittance of greater than or equal to about 30% and less than about 85%, about 40% to about 80%, or about 40% to about 75%. The transparent electrode and the semi-transmissive electrode may include, for example, at least one of an oxide conductor, a carbon conductor, or a metal thin film. The oxide conductors may include, for example, one or more of indium tin oxide (ITO), indium zinc oxide (IZO), zinc tin oxide (ZTO), aluminum tin oxide (ATO), and aluminum zinc oxide (AZO), the carbon conductor may include one or more selected from graphene and carbon nanostructures, and the metal thin film may be a very thin film including aluminum (Al), magnesium (Mg), silver (Ag), gold (Au), magnesium-silver (Mg—Ag), magnesium-aluminum (Mg—Al), an alloy thereof, or any combination thereof.

The first common auxiliary layer 350 may be between the light emitting layers 212, 222, and 232 and the photosensitive layer 330 and the substrate 110, and among them, between the light emitting layers 212, 222, and 232 and the photosensitive layer 330 and the pixel electrodes 211, 221, 231, and 310. The first common auxiliary layer 350 may be continuously be formed as a single piece of material that extends under the light emitting layers 212, 222, and 232 and the photosensitive layer 330 and on the pixel electrodes 211, 221, 231, and 310. As shown, the first, second, and third light emitting elements 210, 220, and 230 and the sensor 300 may include separate, respective portions of a single first common auxiliary layer 350 that is a single piece of material that extends (e.g., extends continuously) on the pixel electrodes 211, 221, 231, and 310, and under the light emitting layers 212, 222, and 232 and the photosensitive layer 330 and between the first, second, and third light emitting elements 210, 220, and 230 and the sensor 300.

The first common auxiliary layer 350 may be a charge auxiliary layer (e.g., hole auxiliary layer) that facilitates injection and/or movement of charge carriers (e.g., holes) from the pixel electrodes 211, 221, and 231 to the light emitting layers 212, 222, and 232. The first common auxiliary layer 350 may include a charge transport material, for example, a hole transport material. For example, the HOMO energy level of the first common auxiliary layer 350 (e.g., hole transport material) may be between the HOMO energy level of the light emitting layers 212, 222, and 232 (the HOMO energy level of the organic light emitting material of the light emitting layer) and the work functions of the pixel electrodes 211, 221, and 231 (conductor of the pixel electrode). The work functions of the pixel electrodes 211, 221, and 231, the HOMO energy levels of the first common auxiliary layer 350, and the HOMO energy levels of the light emitting layers 212, 222, and 232 may be sequentially deepened. For example, the HOMO energy level of the first common auxiliary layer 350 (e.g., hole transport material) may be about 5.3 eV to about 5.6 eV, and may be about 5.3 eV to about 5.5 eV within the above range, but is not limited thereto.

The first common auxiliary layer 350 may include an organic material, an inorganic material, an organic-inorganic material, or any combination thereof satisfying the HOMO energy level, for example a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4',4"-[tris(3-methylphenyl)phenylamino]triphenylamine), TDATA (4,4'4"-tris(N,N-diphenylamino)triphenylamine), 2-TNATA (4,4',4"-tris{N-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/Camphor sulfonic acid), PANI/PSS (polyaniline/poly(4-styrenesulfonate)), NPB (N,N'-di(naphthalene-I-yl)-N,N'-diphenylbenzidine), polyetherketone including triphenylamine (TPAPEK), 4-isopropyl-4'-methyldiphenyliodonium[tetrakis(pentafluorophenyl)borate], HAT-CN (dipyrazino[2,3-f: 2',3'-h] quinoxaline-2,3,6,7,10,11-hexacarbonitrile), a carbazole-based derivative such as N-phenylcarbazole, polyvinylcarbazole, and the like, a fluorene-based derivative, TPD (N,N'-bis(3-methylphenyl)-N,N'-diphenyl-[1,1-biphenyl]-4,4'-diamine), a triphenylamine-based derivative such as TCTA (4,4',4"-tris(N-carbazolyl)triphenylamine), NPB (N,N'-di(naphthalene-I-yl)-N,N'-diphenylbenzidine), TAPC (4,4'-cyclohexylidene bis[N,N-bis(4-methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but is not limited thereto. The first common auxiliary layer 350 may be one layer or two or more layers.

The second common auxiliary layer 340 may be between the light emitting layers 212, 222, and 232 and the photosensitive layer 330 and the common electrode 320, and may be connected to each other to be continuously formed as a single piece of material that extends on the light emitting layers 212, 222, and 232 and the photosensitive layer 330 and under the common electrode 320. As shown, the first, second, and third light emitting elements 210, 220, and 230 and the sensor 300 may include separate, respective portions of a single second common auxiliary layer 340 that is a single piece of material that extends (e.g., extends continuously) on each of the light emitting layers 212, 222, and 232 and the photosensitive layer 330 and under the common electrode 320 and between the first, second, and third light emitting elements 210, 220, and 230 and the sensor 300.

The second common auxiliary layer 340 may be a charge auxiliary layer (e.g., an electron auxiliary layer) that facilitates injection and/or movement of charge carriers (e.g., electrons) from the common electrode 320 to the light emitting layers 212, 222, and 232. The second common auxiliary layer 340 may include a charge transport material, for example, an electron transport material. For example, the LUMO energy level of the second common auxiliary layer 340 (e.g., electron transport material) may be between the LUMO energy level of the light emitting layers 212, 222, and 232 (the organic light emitting material of the light emitting layer) and the work functions of the common electrode 320 (conductor of the common electrode). The LUMO energy level of the light emitting layers 212, 222, and 232 (the organic light emitting material of the light emitting layer) may be shallower than the LUMO energy level of the second common auxiliary layer 340 (e.g., the electron transport material). The work function of the common electrode 320, the LUMO energy level of the second common auxiliary layer 340, and the LUMO energy levels of the light emitting layers 212, 222, and 232 may sequentially become shallow. For example, the LUMO energy level of the second common auxiliary layer 340 (e.g., electron transport material) may be about 2.9 eV to about 3.3 eV, and within the above range, about 2.9 eV to about 3.2 eV, about 2.9 eV to about 3.1 eV, about 3.0 eV to about 3.2 eV, or about 3.0 eV to about 3.1 eV, but is not limited thereto.

The second common auxiliary layer 340 may include an organic material, an inorganic material, an organic-inorganic material, or any combination thereof satisfying the LUMO energy level, for example a halogenated metal such as LiF, NaCl, CsF, RbCl, and RbI; a metal oxide such as Li2O or BaO; Liq (lithium quinolate), Alq3 (tris(8-hydroxyquinolinato)aluminum), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), Bebq2 (berylliumbis(benzoquinolin-10-olate), ADN (9,10-di(naphthalene-2-yl)anthracene), BmPyPhB (1,3-bis[3,5-di(pyridin-3-yl)phenyl]benzene), or any combination thereof, but is not limited thereto. The second common auxiliary layer 340 may be one layer or two or more layers.

The first, second, and third light emitting elements 210, 220, and 230 and the sensor 300 include separate, respective pixel electrodes 211, 221, 231, and 310 facing the common electrode 320. One of the pixel electrodes 211, 221, 231, and 310 or the common electrode 320 is an anode, and the other is a cathode. For example, the pixel electrodes 211, 221, 231, and 310 may be an anode, and the common electrode 320 may be a cathode. The pixel electrodes 211, 221, 231, and 310 are separated for each subpixel PX, and are electrically connected to each separate thin film transistor 120 to be independently driven.

The pixel electrodes 211, 221, 231, and 310 may each be a light transmitting electrode (a transparent electrode or a semi-transmissive electrode) or a reflective electrode. The light transmitting electrode is the same as described above. The reflective electrode may include a reflective layer having a light transmittance of less than or equal to about 5% and/or a reflectance of greater than or equal to about 80%, and the reflective layer may include an optically opaque material. The optically opaque material may include a metal, a metal nitride, or any combination thereof, for example silver (Ag), copper (Cu), aluminum (Al), gold (Au), titanium (Ti), chromium (Cr), nickel (Ni), an alloy thereof, a nitride thereof (e.g., TiN), or any combination thereof, but is not limited thereto. The reflective electrode may be formed of a reflective layer or may have a stacked structure of a reflective layer/transmissive layer or a transmissive layer/reflective layer/transmissive layer, and the reflective layer may be one layer or two or more layers.

For example, when the pixel electrodes 211, 221, 231, and 310 are reflective electrodes and the common electrode 320 is a light transmitting electrode, the sensor-embedded display panel 1000 may be a top emission type display panel configured to emit light toward the opposite side of the substrate 110. For example, when the pixel electrodes 211, 221, 231, and 310 and the common electrode 320 are light transmitting electrodes, respectively, the sensor-embedded display panel 1000 may be a both side emission type display panel configured to emit light toward both the substrate 110 and the opposite side of the substrate 110.

For example, the pixel electrodes 211, 221, 231, and 310 may be reflective electrodes and the common electrode 320 may be a semi-transmissive electrode. In this case, the sensor-embedded display panel 1000 may have a microcavity structure. In the microcavity structure, reflection may occur repeatedly between the reflective electrode and the semi-transmissive electrode separated by a particular (or, alternatively, predetermined) optical length (e.g., a distance between the semi-transmissive electrode and the reflective electrode) and light of a particular (or, alternatively, predetermined) wavelength spectrum may be enhanced to improve optical properties.

For example, among the light emitted from the light emitting layers 212, 222, and 232 of the first, second, and third light emitting elements 210, 220, and 230, light of a particular (or, alternatively, predetermined) wavelength spectrum may be repeatedly reflected between the semi-transmissive electrode and the reflective electrode and then may be modified. Among the modified light, light of a wavelength spectrum corresponding to a resonance wavelength of a microcavity may be enhanced to exhibit amplified light emission characteristics in a narrow wavelength region. Accordingly, the sensor-embedded display panel 1000 may express colors with high color purity.

For example, among the light incident on the sensor 300, light of a particular (or, alternatively, predetermined) wavelength spectrum may be repeatedly reflected between the semi-transmissive electrode and the reflective electrode to be modified. Among the modified light, light having a wavelength spectrum corresponding to the resonance wavelength of a microcavity may be enhanced to exhibit photoelectric conversion characteristics amplified in a narrow wavelength region. Accordingly, the sensor 300 may exhibit high photoelectric conversion characteristics in a narrow wavelength region.

The first, second, and third light emitting elements 210, 220, and 230 include separate, respective light emitting layers 212, 222, and 232 between the pixel electrodes 211, 221, and 231 and the common electrode 320. Each of the light emitting layer 212 included in the first light emitting element 210, the light emitting layer 222 included in the second light emitting element 220, and the light emitting layer 232 included in the third light emitting element 230 may be configured to emit light in the same or different wavelength spectra and may be configured to emit light in, for example a red wavelength spectrum, a green wavelength spectrum, a blue wavelength spectrum, or any combination thereof.

For example, when the first light emitting element 210, the second light emitting element 220, and the third light emitting element 230 are a red light emitting element, a green light emitting element, and a blue light emitting element, respectively, the light emitting layer 212 may be a red light emitting layer configured to emit light in a red wavelength spectrum, the light emitting layer 222 included in the second light emitting element 220 may be a green light emitting layer configured to emit light in a green wavelength spectrum, and the light emitting layer 232 included in the third light emitting element 230 may be a blue light emitting layer configured to emit light in a blue wavelength spectrum. Herein, the red wavelength spectrum, the green wavelength spectrum, and the blue wavelength spectrum may have a peak emission wavelength (λpeak, L) of greater than about 600 nm and less than about 750 nm, about 500 nm to about 600 nm, and greater than or equal to about 380 nm and less than about 500 nm, respectively.

For example, when at least one of the first light emitting element 210, the second light emitting element 220, or the third light emitting element 230 is a white light emitting element, the light emitting layer of the white light emitting element may be configured to emit light of a full visible light wavelength spectrum, for example, light in a wavelength spectrum of greater than or equal to about 380 nm and less than about 750 nm, about 400 nm to about 700 nm, or about 420 nm to about 700 nm.

The light emitting layers 212, 222, and 232 may include at least one host material and a fluorescent or phosphorescent dopant, and at least one of the at least one host material or the fluorescent or phosphorescent dopant may be an organic light emitting material. The organic light emitting material may include, for example, a low molecular organic light emitting material, for example, a vapor depositable organic light emitting material.

The organic light emitting material included in the light emitting layers 212, 222, and 232 is not particularly limited as long as it (the organic light emitting material) is an electroluminescent material capable of emitting light of a particular (or, alternatively, predetermined) wavelength spectrum, and may be, for example, perylene; rubrene; 4-(dicyanomethylene)-2-methyl-6-[p-(dimethylamino) styryl]-4H-pyran; coumarin or a derivative thereof; carbazole or a derivative thereof; TPBi (2,2',2"-(1,3,5-benzinetriyl)-tris(1-phenyl-1-H-benzimidazole); TBADN (2-t-butyl-9,10-di(naphth-2-yl)anthracene); AND (9,10-di (naphthalene-2-yl)anthracene); CBP (4,4'-bis(N-carbazolyl)-1,1'-biphenyl); TCTA (4,4',4"-tris(carbazol-9-yl)-triphenylamine); TPBi (1,3,5-tris(N-phenylbenzimidazole-2-yl)benzene); TBADN (3-tert-butyl-9,10-di(naphth-2-yl)anthracene); DSA (distyrylarylene); CDBP (4,4'-bis(9-carbazolyl)-2,2'-dimethylbiphenyl); MADN (2-methyl-9,10-bis(naphthalen-2-yl)anthracene); TCP (1,3,5-tris(carbazol-9-yl)benzene); Alq3 (tris(8-hydroxyquinolino)lithium); an organometallic compound including Pt, Os, Ti, Zr, Hf, Eu, Tb, Tm, Rh, Ru, Re, Be, Mg, Al, Ca, Mn, Co, Cu, Zn, Ga, Ge, Pd, Ag, and/or Au, a derivative thereof, or any combination thereof, but is not limited thereto.

The organic light emitting material included in the light emitting layers 212, 222, and 232 may be a depositable organic light emitting material that may be vaporized (sublimated) at a particular (or, alternatively, predetermined) temperature to be deposited, and may have a particular (or, alternatively, predetermined) sublimation temperature (Ts). Herein, the sublimation temperature of a material may be a temperature at which a weight loss of 10% relative to the initial weight of the material occurs during thermogravimetric analysis (TGA) of the material at a low pressure (e.g., low ambient pressure at the material) of about 10 Pa or less (e.g., about 0 Pa to about 10 Pa, about 0.01 Pa to about 10 Pa, about 0.1 Pa to about 10 Pa, about 1 Pa to about 10 Pa, etc.), and may be a deposition temperature during the process or a set temperature of a deposition chamber used in the process.

The sublimation temperature (Ts) of the organic light emitting material included in the light emitting layer 212, 222, and 232 may be less than or equal to about 350° C., and within the above range, less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., or less than or equal to about 250° C., about 100° C. to about 350° C., about 100° C. to about 340° C., about 100° C. to about 330° C., about 100° C. to about 320° C., about 100° C. to about 310° C., about 100° C. to about 300° C., about 100° C. to about 290° C., about 100° C. to about 280° C., about 100° C. to about 270° C., about 100° C. to about 260° C., about 100° C. to about 250° C., about 150° C. to about 350° C., about 150° C. to about 340° C., about 150° C. to about 330° C., about 150° C. to about 320° C., about 150° C. to about 310° C., about 150° C. to about 300° C., about 150° C. to about 290° C., about 150° C. to about 280° C., about 150° C. to about 270° C., about 150° C. to about 260° C., or about 150° C. to about 250° C. When the organic light emitting material has a sublimation temperature within the above range, it may be effectively deposited without substantial decomposition and/or deterioration of the organic light emitting material.

The sensor 300 includes a photosensitive layer 330 between the pixel electrode 310 and the common electrode 320. The photosensitive layer 330 may be between the first common auxiliary layer 350 and the second common auxiliary layer 340. The photosensitive layer 330 is at least partially in parallel with the light emitting layers 212, 222, and 232 of the first, second, and third light emitting elements 210, 220, and 230 along the in-plane direction (e.g., xy direction) of the substrate 110. The photosensitive layer 330 and the light emitting layers 212, 222, and 232 may be on the same plane.

The photosensitive layer 330 may be a photoelectric conversion layer configured to absorb light of a particular (or, alternatively, predetermined) wavelength spectrum and convert it (the absorbed light) into an electrical signal, and may be configured to absorb light emitted from at least one of the aforementioned first, second, or third light emitting elements 210, 220, or 230 and then reflected by the recognition target 40 and may be configured to convert it (the absorbed light) into an electrical signal. The photosensitive layer 330 may be configured to absorb light of, for example, a red wavelength spectrum, a green wavelength spectrum, a blue wavelength spectrum, or any combination thereof.

For example, the photosensitive layer 330 may be configured to selectively absorb light of a green wavelength spectrum having a peak absorption wavelength ($\lambda_{peak,A}$) in a wavelength region of about 500 nm to about 600 nm, and may be configured to absorb light that is emitted from the green light emitting element among the first, second, and third light emitting elements 210, 220, and 230 and then reflected by the recognition target 40. The peak absorption wavelength ($\lambda_{peak,A}$) of the photosensitive layer 330 may belong to about 510 nm to about 580 nm, about 520 nm to about 570 nm, about 520 nm to about 560 nm, or about 520 nm to about 550 nm within the above range.

The photosensitive layer 330 includes a first semiconductor layer **330*p* close to the first common auxiliary layer 350 and a second semiconductor layer 330*q* close to the second common auxiliary layer 340. For example, as shown in at least FIG. 2, the photosensitive layer 330 may include a first semiconductor layer 330*p* and a second semiconductor layer 330*q*, where the first semiconductor layer 330*p* is proximate (e.g., closer) to the first common auxiliary layer 350 in relation to the second common auxiliary layer 340 and the second semiconductor layer 330*q*** is proximate (e.g., closer)

to the second common auxiliary layer 340 in relation to the first common auxiliary layer 350. The first semiconductor layer 330*p* and the second semiconductor layer 330*q* may form a pn junction, and after receiving light from the outside (e.g., incident light) to generate excitons, the generated excitons are separated into holes and electrons to be moved into a pixel electrode 310 and the common electrode 320, respectively. An additional auxiliary layer (not shown) may be further included between the first semiconductor layer 330*p* and the first common auxiliary layer 350.

The first semiconductor layer 330*p* may include a p-type semiconductor. The p-type semiconductor may be a light absorbing semiconductor, and for example, may be configured to absorb at least a portion of the visible light wavelength spectrum, for example, light of a red wavelength spectrum, a green wavelength spectrum, a blue wavelength spectrum, or any combination thereof. The p-type semiconductor may be, for example, an organic light absorbing semiconductor, and may be a low-molecular light absorbing material that exhibits the aforementioned photoelectric conversion characteristics and may be evaporated (sublimated) and deposited at a particular (or, alternatively, predetermined) temperature.

For example, the p-type semiconductor may be for example represented by Chemical Formula 1A.

[Chemical Formula 1A]

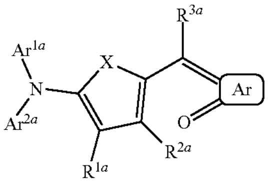

In Chemical Formula 1A, X may be S, Se, Te, SO, $SO_2$, or $SiR^aR^b$, Ar may be a substituted or unsubstituted C6 to C30 arylene group, a substituted or unsubstituted C3 to C30 heterocyclic group, or a fused ring of the foregoing two or more, $Ar^{1a}$ and $Ar^{2a}$ may independently be a substituted or unsubstituted C6 to C30 aryl group or a substituted or unsubstituted C3 to C30 heteroaryl group, $Ar^{1a}$ and $Ar^{2a}$ may independently be present alone or may be linked with each other to form a fused ring, and $R^{1a}$ to $R^{3a}$, $R^a$, and $R^b$ may independently be hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, in Chemical Formula 1A, $Ar^{1a}$ and $Ar^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group. For example, $Ar^{1a}$ and $Ar^{2a}$ of Chemical Formula 1A may be linked with each other to form a ring or for example, $Ar^{1a}$ and $Ar^{2a}$ may be linked with each other by one of a single bond, $-(CR^gR^h)_{n2}-$ (n2 is 1 or 2), —O—, —S—, —Se—, —N=, $-NR^i-$, $-SiR^jR^k-$, or $-GeR^lR^m-$ to form a ring. Herein, $R^g$ to $R^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the p-type semiconductor may be for example represented by Chemical Formula 1B.

[Chemical Formula 1B]

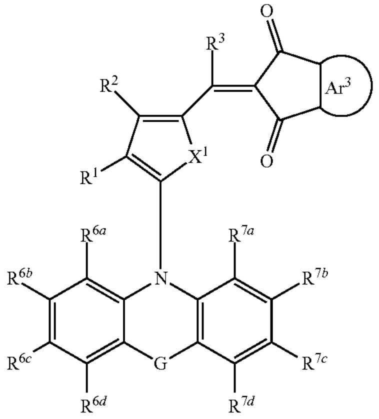

In Chemical Formula 1B, $X^1$ may be Se, Te, O, S, SO, or $SO_2$, $Ar^3$ may be a substituted or unsubstituted C6 to C30 arylene group, a substituted or unsubstituted C3 to C30 heterocyclic group, or a fused ring of the foregoing two or more, $R^1$ to $R^3$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, or any combination thereof, G may be one of a single bond, —O—, —S—, —Se—, —N=, $-(CR^fR^g)_k-$, $-NR^h-$, $-SiR^iR^j-$, $-GeR^kR^l-$, $-(C(R^m)=C(R^n))-$, or $SnR^oR^p$, wherein $R^f$, $R^g$, $R^h$, $R^i$, $R^j$, $R^k$, $R^l$, $R^m$, $R^n$, $R^o$, and $R^p$ may independently be one of hydrogen, a halogen, a substituted or unsubstituted C1 to C10 alkyl group, a substituted or unsubstituted C1 to C10 alkoxy group, or a substituted or unsubstituted C6 to C12 aryl group, $R^f$ and $R^g$, $R^i$ and $R^j$, $R^k$ and $R^l$, $R^m$ and $R^n$, and $R^o$ and $R^p$ may independently be present alone or may be linked with each other to provide a ring, and k may be 1 or 2, $R^{6a}$ to $R^{6d}$ and $R^{7a}$ to $R^{7d}$ may independently be one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, or any combination thereof, $R^{6a}$ to $R^{6d}$ may independently be present alone or adjacent two thereof may be linked with each other to form a fused ring, and $R^{7a}$ to $R^{7d}$ may independently be present alone or adjacent two thereof may be linked with each other to form a fused ring.

For example, $Ar^3$ of Chemical Formula 1B may be a benzene ring, a naphthylene ring, an anthracene ring, a thiophene ring, a selenophene ring, a tellurophene ring, a pyridine ring, a pyrimidine ring, or a fused ring of the foregoing two or more. The n-type semiconductor may be for example fullerene or a fullerene derivative, but is not limited thereto.

The p-type semiconductor may have an energy level capable of forming effective electrical matching with the adjacent first common auxiliary layer 350 so that holes separated from excitons may be effectively moved and/or extracted toward the pixel electrode 310. For example, a difference between the HOMO energy level of the first common auxiliary layer 350 and the HOMO energy level of the p-type semiconductor may be less than about 1.0 eV, within the above range, less than or equal to about 0.9 eV, less than or equal to about 0.8 eV, less than or equal to about 0.7 eV, or less than or equal to about 0.5 eV, greater than or equal to about 0 eV and less than about 1.0 eV, about 0 eV to about 0.9 eV, about 0 eV to about 0.8 eV, about 0 eV to about 0.7 eV, about 0 eV to about 0.5 eV, greater than or equal to about 0.01 eV and less than about 1.0 eV, about 0.01 eV to about 0.9 eV, about 0.01 eV to about 0.8 eV, about 0.01 eV to about 0.7 eV, or about 0.01 eV to about 0.5 eV.

The sublimation temperature of the p-type semiconductor may be less than or equal to about 300° C., within the above range, less than or equal to about 290° C., less than or equal to about 280° C., less than or equal to about 270° C., less than or equal to about 260° C., or less than or equal to about 250° C., about 100° C. to about 300° C., about 100° C. to about 290° C., about 100° C. to about 280° C., about 100° C. to about 270° C., about 100° C. to about 260° C., about 100° C. to about 250° C., about 150° C. to about 300° C., about 150° C. to about 290° C., about 150° C. to about 280° C., about 150° C. to about 270° C., about 150° C. to about 260° C., about 150° C. to about 250° C., about 200° C. to about 300° C., about 200° C. to about 290° C., about 200° C. to about 280° C., about 200° C. to about 270° C., about 200° C. to about 260° C., or about 200° C. to about 250° C.

The second semiconductor layer 330*q* may include an n-type semiconductor. The n-type semiconductor may form a pn junction with the aforementioned p-type semiconductor, and may be, for example, a transparent semiconductor that does not absorb or does not substantially absorb light in the visible wavelength spectrum. The transparent semiconductor may have a wide energy bandgap so as not to substantially absorb light of a visible wavelength spectrum, for example, an energy bandgap of greater than or equal to about 2.5 eV and within the range, for example, an energy bandgap of about 2.5 eV to about 4.0 eV or about 2.5 eV to about 3.5 eV. The n-type semiconductor may be a non-fullerene n-type semiconductor that does not include fullerene or a fullerene derivative (e.g., does not include any fullerene and/or does not include any fullerene derivative), and the n-type semiconductor may be, for example, a transparent organic semiconductor.

For example, the n-type semiconductor may be a compound represented by Chemical Formula 2A or 2B.

[Chemical Formula 2A]

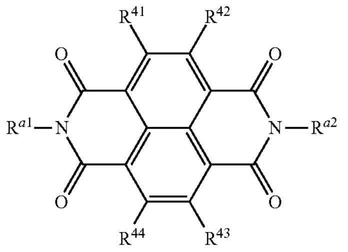

[Chemical Formula 2B]

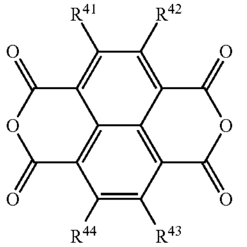

In Chemical Formulas 2A and 2B, $R^{41}$ to $R^{44}$, $R^{a1}$, and $R^{a2}$ are each independently hydrogen, a substituted or unsubstituted C1 to C30 alkyl group, a substituted or unsubstituted C6 to C30 aryl group, a substituted or unsubstituted C3 to C30 heterocyclic group, a halogen, a cyano group, or any combination thereof.

For example, at least one of $R^{a1}$ or $R^{a2}$ may include an electron withdrawn group, and for example at least one of $R^{a1}$ or $R^{a2}$ may include a halogen; a cyano group; a halogen-substituted C1 to C30 alkyl group; a halogen-substituted C6 to C30 aryl group; a halogen-substituted C3 to C30 heterocyclic group; a cyano-substituted C1 to C30 alkyl group; a cyano-substituted C6 to C30 aryl group; a cyano-substituted C3 to C30 heterocyclic group; a substituted or unsubstituted pyridinyl group; a substituted or unsubstituted pyrimidinyl group; a substituted or unsubstituted triazinyl group; a substituted or unsubstituted pyrazinyl group; a substituted or unsubstituted quinolinyl group; a substituted or unsubstituted isoquinolinyl group; a substituted or unsubstituted quinazolinyl group; a C1 to C30 alkyl group substituted with a substituted or unsubstituted pyridinyl group; a C6 to C30 aryl group substituted with a substituted or unsubstituted pyridinyl group; a C1 to C30 alkyl group substituted with a substituted or unsubstituted pyrimidinyl group; a C6 to C30 aryl group substituted with a substituted or unsubstituted pyrimidinyl group; a C1 to C30 alkyl group substituted with a substituted or unsubstituted triazinyl group; a C6 to C30 aryl group substituted with a substituted or unsubstituted triazinyl group; a C1 to C30 alkyl group substituted with a substituted or unsubstituted pyrazinyl group; a C6 to C30 aryl group substituted with a substituted or unsubstituted pyrazinyl group; a C1 to C30 alkyl group substituted with a substituted or unsubstituted quinolinyl group; a C6 to C30 aryl group substituted with a substituted or unsubstituted quinolinyl group; a C1 to C30 alkyl group substituted with a substituted or unsubstituted isoquinolinyl group; a C6 to C30 aryl group substituted with a substituted or unsubstituted isoquinolinyl group; a C1 to C30 alkyl group substituted with a substituted or unsubstituted quinazolinyl group; a C6 to C30 aryl group substituted with a substituted or unsubstituted quinazolinyl group; or any combination thereof.

The n-type semiconductor may have an energy level capable of effectively forming a pn junction with a p-type semiconductor, and accordingly, it is effective to have a relatively deep LUMO energy level for high charge separation efficiency from excitons. For example, the LUMO energy level of the n-type semiconductor may be greater than about 2.9 eV, within the range, greater than or equal to about 3.0 eV, greater than or equal to about 3.1 eV, or greater than or equal to about 3.2 eV, and within the range, greater than about 2.9 eV and less than or equal to about 3.8 eV, about 3.0 eV to about 3.8 eV, about 3.1 eV to about 3.8 eV, about 3.2 eV to about 3.8 eV, greater than about 2.9 eV and less than or equal to about 3.5 eV, about 3.0 eV to about 3.5 eV, about 3.1 eV to about 3.5 eV, or about 3.2 eV to about 3.5 eV.

The LUMO energy level of the n-type semiconductor may be deeper than that (e.g., the LUMO energy level) of the second common auxiliary layer 340 (e.g., an electron transport material of the second common auxiliary layer 340). For example, the LUMO energy level of the n-type semiconductor may deeper than the LUMO energy level of the second common auxiliary layer 340 within less than about 1.0 eV, within the range, less than or equal to about 0.9 eV, less than or equal to about 0.8 eV, less than or equal to about 0.7 eV, or less than or equal to about 0.5 eV much deeper, and greater than or equal to about 0.01 eV and less than about 1.0 eV, about 0.01 eV to about 0.9 eV, about 0.01 eV to about 0.8 eV, about 0.01 eV to about 0.7 eV, or about 0.01 eV to about 0.5 eV much deeper.

The p-type semiconductor of the first semiconductor layer 330*p* and the n-type semiconductor of the second semiconductor layer 330*q* may have a relatively small difference in sublimation temperature so that they can be continuously deposited in the same chamber. For example, a difference between the sublimation temperatures of the p-type semiconductor and n-type semiconductor may be less than about 150° C., within the above range, for example less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., less than or equal to about 20° C., less than or equal to about 15° C., or less than or equal to about 10° C., within the above range, greater than or equal to about 0° C. and less than about 150° C., about 0° C. to about 140° C., about 0° C. to about 130° C., about 0° C. to about 120° C., about 0° C. to about 110° C., about 0° C. to about 100° C., about 0° C. to about 90° C., about 0° C. to about 80° C., about 0° C. to about 70° C., about 0° C. to about 60° C., about 0° C. to about 50° C., about 0° C. to about 40° C., about 0° C. to about 30° C., about 0° C. to about 20° C., about 0° C. to about 15° C., about 0° C. to about 10° C., greater than or equal to about 2° C. and less than about 150° C., about 2° C. to about 140° C., about 2° C. to about 130° C., about 2° C. to about 120° C., about 2° C. to about 110° C., about 2° C. to about 100° C., about 2° C. to about 90° C., about 2° C. to about 80° C., 2° C. to about 70° C., about 2° C. to about 60° C., about 2° C. to about 50° C., about 2° C. to about 40° C., about 2° C. to about 30° C., about 2° C. to about 20° C., about 2° C. to about 15° C., or about 2° C. to about 10° C.

For example, the sublimation temperature of the n-type semiconductor may be less than or equal to about 380° C., within the above range, less than or equal to about 360° C., less than or equal to about 350° C., less than or equal to about 330° C., less than or equal to about 320° C., less than or equal to about 300° C., less than or equal to about 280° C., less than or equal to about 270° C., less than or equal to about 260° C., or less than or equal to about 250° C., about 100° C. to about 380° C., about 100° C. to about 360° C., about 100° C. to about 350° C., about 100° C. to about 330° C., about 100° C. to about 320° C., about 100° C. to about 300° C., about 100° C. to about 280° C., about 100° C. to about 270° C., about 100° C. to about 260° C., about 100° C. to about 250° C., about 150° C. to about 380° C., about 150° C. to about 360° C., about 150° C. to about 350° C., about 150° C. to about 330° C., about 150° C. to about 320° C., about 150° C. to about 300° C., about 150° C. to about 290° C., about 150° C. to about 280° C., about 150° C. to about 270° C., about 150° C. to about 260° C., about 150° C. to about 250° C., about 200° C. to about 380° C., about 200° C. to about 360° C., about 200° C. to about 350° C., about 200° C. to about 330° C., about 200° C. to about 320° C., about 200° C. to about 300° C., about 200° C. to about 290° C., about 200° C. to about 280° C., about 200° C. to about 270° C., about 200° C. to about 260° C., or about 200° C. to about 250° C.

For example, the sublimation temperatures of the p-type semiconductor and n-type semiconductor may be less than or equal to about 300° C., respectively, and may be about 100° C. to about 300° C. within the above range.

For example, as described above, the light emitting layers 212, 222, and 232 of the light emitting elements 210, 220, and 230 may include organic light emitting materials, and the organic light emitting materials of the light emitting layers 212, 222, and 232 and the p-type and n-type semiconductors of the photosensitive layer 330 may be vacuum-deposited in the same chamber. Accordingly, differences between the sublimation temperatures of the organic light emitting materials of the light emitting layers 212, 222, and 232 and the p-type and n-type semiconductors of the photosensitive layer 330 may be relatively small, and for example, the differences in the sublimation temperatures of the organic light emitting materials and the p-type and n-type semiconductors may be less than about 150° C., within the above range, for example less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., less than or equal to about 20° C., less than or equal to about 15° C., or less than or equal to about 10° C., within the above range, greater than or equal to about 0° C. and less than about 150° C., about 0° C. to about 140° C., about 0° C. to about 130° C., about 0° C. to about 120° C., about 0° C. to about 110° C., about 0° C. to about 100° C., about 0° C. to about 90° C., about 0° C. to about 80° C., about 0° C. to about 70° C., about 0° C. to about 60° C., about 0° C. to about 50° C., about 0° C. to about 40° C., about 0° C. to about 30° C., about 0° C. to about 20° C., about 0° C. to about 15° C., about 0° C. to about 10° C., greater than or equal to about 2° C. and less than about 150° C., about 2° C. to about 140° C., about 2° C. to about 130° C., about 2° C. to about 120° C., about 2° C. to about 110° C., about 2° C. to about 100° C., about 2° C. to about 90° C., about 2° C. to about 80° C., about 2° C. to about 70° C., about 2° C. to about 60° C., about 2° C. to about 50° C., about 2° C. to about 40° C., about 2° C. to about 30° C., about 2° C. to about 20° C., about 2° C. to about 15° C., or about 2° C. to about 10° C.

For example, the sublimation temperatures of the organic light emitting materials of the light emitting layer 212, 222, and 232 may be less than or equal to about 350° C., within the above range, less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., or less than or equal to about 250° C., about 100° C. to about 350° C., about 100° C. to about 340° C., about 100° C. to about 330° C., about 100° C. to about 320° C., about 100° C. to about 310° C., about 100° C. to about 300° C., about 100° C. to about 290° C., about 100° C. to about 280° C., about 100° C. to about 270° C., about 100° C. to about 250° C., about 150° C. to about 350° C., about 150° C. to about 340° C., about 150° C. to about 330° C., about 150° C. to about 320° C., about 150° C. to about 310° C., about 150° C. to about 300° C., about 150° C. to about 290° C., about 150° C. to about 280° C., about 150° C. to about 270° C., or about 150° C. to about 250° C.

For example, the sublimation temperatures of the organic light emitting materials of the light emitting layers 212, 222, and 232, the p-type and n-type semiconductors of the photosensitive layer 330 may be less than or equal to about 300° C., respectively, and within the above range, about 100° C. to about 300° C.

Each thickness of the light emitting layers 212, 222, and 232 and the photosensitive layer 330 may each independently be about 5 nm to about 300 nm, about 10 nm to about 250 nm, about 20 nm to about 200 nm, or about 30 nm to about 180 nm within the above range. Differences between the thicknesses of the light emitting layers 212, 222, and 232 and the photosensitive layer 330 may be less than or equal to about 20 nm, less than or equal to about 15 nm, less than or equal to about 10 nm, or less than or equal to about 5 nm within the above range, and the thicknesses of the light emitting layers 212, 222, and 232 and the photosensitive layer 330 may be substantially the same.

In some example embodiments, when the n-type semiconductor (e.g., of the second semiconductor layer 330*q*) has a relatively deep LUMO energy level for high charge separation efficiency from excitons in the photosensitive layer 330, as described above, the LUMO energy level of the n-type semiconductor may be mismatched with that of the second common auxiliary layer 340, resulting in deteriorating electron transfer and/or extraction efficiency.

In other words, in order to effectively transfer and/or extract electrons from the photosensitive layer 330 to the common electrode 320, the LUMO energy level of the second semiconductor layer 330*q* (n-type semiconductor) may be shallower than that of the second common auxiliary layer 340 (electron transport material), and the LUMO energy level of the second common auxiliary layer 340 (electron transport material) may be shallower than that of the common electrode 320 (conductor), which may make the electrons effectively move through the stepwise LUMO energy levels. On the contrary, when a n-type semiconductor having a relatively deep LUMO energy is selected (e.g., to comprise the second semiconductor layer 330*q*) in order to secure high charge separation efficiency between the first semiconductor layer 330*p* (p-type semiconductor) and the second semiconductor layer 330*q* (n-type semiconductor) in the photosensitive layer 330, as described above, the LUMO energy level of the second common auxiliary layer 340 becomes shallower than that (e.g., the LUMO energy level) of the second semiconductor layer 330*q* (n-type semiconductor), resultantly deteriorating the electron transfer and/or extraction efficiency. In other words, depending on a LUMO level of the n-type semiconductor, the charge separation efficiency may have trade-off relationship with the electron transport and/or extraction efficiency.

The sensor 300 further includes an insertion layer 360 between the photosensitive layer 330 and the second common auxiliary layer 340 in order to reduce, minimize, or prevent such a trade-off relationship and thus to provide a sensor, and thus a sensor-embedded display panel 1000 including same, which provides good charge separation efficiency without compromising electron transport and/or extraction efficiency and/or good electron transport and/or extraction efficiency without compromising charge separation efficiency, and thus may configure the sensor 300 to exhibit improved functionality (e.g., light sensing functionality, image generating functionality, power consumption efficiency, etc.), based on providing good charge separation efficiency with good electron transport and/or extraction efficiency and/or good electron transport and avoiding the aforementioned trade-off relationship, due to including the insertion layer 360. The insertion layer 360 may be disposed (inserted) between the second semiconductor layer 330*q* and the second common auxiliary layer 340, for example, one surface of the insertion layer 360 may contact the second semiconductor layer 330*q*, while the other surface of the insertion layer 360 (e.g., an opposite surface of the insertion layer 360 in relation to the one surface thereof, also referred to herein as an upper surface 360*u*) may contact the second common auxiliary layer 340.

The insertion layer 360 between the second semiconductor layer 330*q* and the second common auxiliary layer 340 may increase the electron transfer and/or extraction from the second semiconductor layer 330*q* to the second common auxiliary layer 340. Accordingly, even when the n-type semiconductor having relatively deep LUMO energy is included to secure high charge separation efficiency between the first semiconductor layer 330*p* (p-type semiconductor) and the second semiconductor layer 330*q* (n-type semiconductor), the deterioration of the electron transfer and/or extraction efficiency may be reduced or prevented. Accordingly, the aforementioned trade-off relationship may be reduced, minimized, or prevented, improving electric characteristics of the sensor 300 and thus improving thereby improving the functionality (e.g., light sensing functionality, image generating functionality, power consumption efficiency, etc.) of the sensor 300 based on including the insertion layer 360.

The insertion layer 360 may include, for example, a metal, a metal compound, or any combination thereof. The insertion layer 360 may include a metal or metal compound having a work function or an energy level capable of electrically matching with the energy levels of the second semiconductor layer 330*q* (n-type semiconductor) and the second common auxiliary layer 340 (electron transport material), for example, the work function of the metal or the LUMO energy level of the metal compound respectively may be less than about 1.3 eV deeper or shallower than the LUMO energy level of the second semiconductor layer 330*q* (n-type semiconductor, for example the non-fullerene n-type semiconductor of the second semiconductor layer 330*q*) and the LUMO energy level of the second common auxiliary layer 340 (electron transport material). In other words, a difference between the work function of the metal or the LUMO energy level of the metal compound of the insertion layer 360 and the LUMO energy level of the second semiconductor layer 330*q* (n-type semiconductor) may be within about ±1.3 eV (e.g., within about 0 eV to about ±1.3 eV, about ±0.01 eV to about ±1.3 eV, about ±0.1 eV to about ±1.3 eV, about ±0.2 eV to about ±1.3 eV, about ±0.5 eV to about ±1.3 eV, or the like), and a difference between the work function of the metal or the LUMO energy level of the metal compound of the insertion layer 360 and the LUMO energy level of the second common auxiliary layer 340 (electron transport material) may be within about ±1.3 eV (e.g., within about 0 eV to about ±1.3 eV, about ±0.01 eV to about ±1.3 eV, about ±0.1 eV to about ±1.3 eV, about ±0.2 eV to about ±1.3 eV, about ±0.5 eV to about ±1.3 eV, or the like). Within the ranges, the work function of the metal or the LUMO energy level of the metal compound may be deeper or shallower than the LUMO energy level of the second semiconductor layer 330*q* (n-type semiconductor) and the LUMO energy level of the second common auxiliary layer 340 (electron transport material) respectively within about 1.2 eV, within about 1.1 eV, within about 1.0 eV, within about 0.8 eV, within about 0.6 eV, or within about 0.5 eV. For example, the work function of the metal and/or the LUMO energy level of the metal compound may be deeper or shallower than the LUMO energy level of the second semiconductor layer 330*q* (n-type semiconductor) and the LUMO energy level of the second common auxiliary layer 340 (electron transport material) by about 0 eV to about 1.3 eV, about 0.01 eV to about 1.3 eV, about 0.1 eV to about 1.3 eV, about 0.2 eV to about 1.3 eV, about 0.5 eV to about 1.3 eV, or the like, respectively.

For example, the work function of the metal or the LUMO energy level of the metal compound included in the insertion layer 360 may be within about 2.8 eV to about 4.2 eV, within the range, about 2.8 eV to about 4.1 eV, about 2.8 eV to about 4.0 eV, about 2.9 eV to about 4.2 eV, about 2.9 eV to about 4.1 eV, about 2.9 eV to about 4.0 eV, about 2.9 eV to about 3.8 eV, about 2.9 eV to about 3.6 eV, about 2.9 eV to about 3.5 eV, about 3.0 eV to about 3.6 eV, or about 3.0 eV to about 3.5 eV.

The metal may be and/or include, for example, lanthanides, aluminum (Al), calcium (Ca), potassium (K), magnesium (Mg), an alloy thereof, or any combination thereof, but is not limited thereto. Herein, the lanthanides may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu). For example, the metal may be ytterbium (Yb), aluminum (Al), calcium (Ca), potassium (K), magnesium (Mg), an alloy thereof, or any combination thereof.

The metal compound may be, for example, an oxide or sulfide containing at least one of titanium (Ti), tin (Sn), magnesium (Mg), zinc (Zn), or zirconium (Zr), but is not limited thereto.

For example, in some example embodiments the insertion layer 360 may include (e.g., comprise or consist of) a metal, where the metal may have a work function capable of electrically matching with the energy levels of the second semiconductor layer 330*q* (n-type semiconductor) and the second common auxiliary layer 340 (electron transport material), for example, the work function of the metal may be less than about 1.3 eV deeper or shallower than the LUMO energy level of the second semiconductor layer 330*q* (n-type semiconductor, for example the non-fullerene n-type semiconductor of the second semiconductor layer 330*q*) and the LUMO energy level of the second common auxiliary layer 340 (electron transport material). In other words, a difference between the work function of the metal of the insertion layer 360 and the LUMO energy level of the second semiconductor layer 330*q* (n-type semiconductor) may be within about ±1.3 eV (e.g., within about 0 eV to about ±1.3 eV, about ±0.01 eV to about ±1.3 eV, about ±0.1 eV to about ±1.3 eV, about ±0.2 eV to about ±1.3 eV, about ±0.5 eV to about ±1.3 eV, or the like), and a difference between the work function of the metal of the insertion layer 360 and the LUMO energy level of the second common auxiliary layer 340 (electron transport material) may be within about ±1.3 eV (e.g., within about 0 eV to about ±1.3 eV, about ±0.01 eV to about ±1.3 eV, about ±0.1 eV to about ±1.3 eV, about ±0.2 eV to about ±1.3 eV, about ±0.5 eV to about ±1.3 eV, or the like). Within the ranges, the work function of the metal may be deeper or shallower than the LUMO energy level of the second semiconductor layer 330*q* (n-type semiconductor) and the LUMO energy level of the second common auxiliary layer 340 (electron transport material) respectively within about 1.2 eV, within about 1.1 eV, within about 1.0 eV, within about 0.8 eV, within about 0.6 eV, or within about 0.5 eV. For example, the work function of the metal may be deeper or shallower than the LUMO energy level of the second semiconductor layer 330*q* (n-type semiconductor) and the LUMO energy level of the second common auxiliary layer 340 (electron transport material) by about 0 eV to about 1.3 eV, about 0.01 eV to about 1.3 eV, about 0.1 eV to about 1.3 eV, about 0.2 eV to about 1.3 eV, about 0.5 eV to about 1.3 eV, or the like, respectively.

For example, in some example embodiments the insertion layer 360 may include (e.g., comprise or consist of) a metal compound, where the metal compound may have an energy level capable of electrically matching with the energy levels of the second semiconductor layer 330*q* (n-type semiconductor) and the second common auxiliary layer 340 (electron transport material), for example, the LUMO energy level of the metal compound may be less than about 1.3 eV deeper or shallower than the LUMO energy level of the second semiconductor layer 330*q* (n-type semiconductor, for example the non-fullerene n-type semiconductor of the second semiconductor layer 330*q*) and the LUMO energy level of the second common auxiliary layer 340 (electron transport material). In other words, a difference between the LUMO energy level of the metal compound of the insertion layer 360 and the LUMO energy level of the second semiconductor layer 330*q* (n-type semiconductor) may be within about ±1.3 eV (e.g., within about 0 eV to about ±1.3 eV, about ±0.01 eV to about ±1.3 eV, about ±0.1 eV to about ±1.3 eV, about ±0.2 eV to about ±1.3 eV, about ±0.5 eV to about ±1.3 eV, or the like), and a difference between the LUMO energy level of the metal compound of the insertion layer 360 and the LUMO energy level of the second common auxiliary layer 340 (electron transport material) may be within about ±1.3 eV (e.g., within about 0 eV to about ±1.3 eV, about ±0.01 eV to about ±1.3 eV, about ±0.1 eV to about ±1.3 eV, about ±0.2 eV to about ±1.3 eV, about ±0.5 eV to about ±1.3 eV, or the like). Within the ranges, the LUMO energy level of the metal compound may be deeper or shallower than the LUMO energy level of the second semiconductor layer 330*q* (n-type semiconductor) and the LUMO energy level of the second common auxiliary layer 340 (electron transport material) respectively within about 1.2 eV, within about 1.1 eV, within about 1.0 eV, within about 0.8 eV, within about 0.6 eV, or within about 0.5 eV. For example, the LUMO energy level of the metal compound may be deeper or shallower than the LUMO energy level of the second semiconductor layer 330*q* (n-type semiconductor) and the LUMO energy level of the second common auxiliary layer 340 (electron transport material) by about 0 eV to about 1.3 eV, about 0.01 eV to about 1.3 eV, about 0.1 eV to about 1.3 eV, about 0.2 eV to about 1.3 eV, about 0.5 eV to about 1.3 eV, or the like, respectively.

For example, in some example embodiments the insertion layer 360 may include (e.g., comprise or consist of) a combination of a metal and a metal compound, where 1) the metal may have a work function capable of electrically matching with the energy levels of the second semiconductor layer 330*q* (n-type semiconductor) and the second common auxiliary layer 340 (electron transport material) and 2) the metal compound may have an energy level capable of electrically matching with the energy levels of the second semiconductor layer 330*q* (n-type semiconductor) and the second common auxiliary layer 340 (electron transport material). For example, each of the work function of the metal and the LUMO energy level of the metal compound may be less than about 1.3 eV deeper or shallower than the LUMO energy level of the second semiconductor layer 330*q* (n-type semiconductor, for example the non-fullerene n-type semiconductor of the second semiconductor layer 330*q*) and the LUMO energy level of the second common auxiliary layer 340 (electron transport material). In other words, each of 1a) a difference between the work function of the metal of the insertion layer 360 and the LUMO energy level of the second semiconductor layer 330*q* (n-type semiconductor) and 1b) a difference between the LUMO energy level of the metal compound of the insertion layer 360 and the LUMO energy level of the second semiconductor layer 330*q* (n-type semiconductor) may be within about ±1.3 eV (e.g., within about 0 eV to about ±1.3 eV, about ±0.01 eV to about ±1.3 eV, about ±0.1 eV to about ±1.3 eV, about ±0.2 eV to about ±1.3 eV, about ±0.5 eV to about ±1.3 eV, or the like), and each of 2a) a difference between the work function of the metal of the insertion layer 360 and the LUMO energy level of the second common auxiliary layer 340 (electron transport material) and 2b) a difference between the LUMO energy level of the metal compound of the insertion layer 360 and the LUMO energy level of the second common auxiliary layer 340 (electron transport material) may be within about ±1.3 eV (e.g., within about 0 eV to about ±1.3 eV, about ±0.01 eV to about ±1.3 eV, about ±0.1 eV to about ±1.3 eV, about ±0.2 eV to about ±1.3 eV, about ±0.5 eV to about ±1.3 eV, or the like). Within the ranges, each of the work function of the metal and the LUMO energy level of the metal compound may be deeper or shallower than the LUMO energy level of the second semiconductor layer 330*q* (n-type semiconductor) and the LUMO energy level of the second common auxiliary layer 340 (electron transport material) respectively within about 1.2 eV, within about 1.1 eV, within about 1.0 eV, within about 0.8 eV, within about 0.6 eV, or within about 0.5 eV. For example, each of the work function of the metal and the LUMO energy level of the metal compound may be deeper or shallower than the LUMO energy level of the second semiconductor layer 330*q* (n-type semiconductor) and the LUMO energy level of the second common auxiliary layer 340 (electron transport material) by about 0 eV to about 1.3 eV, about 0.01 eV to about 1.3 eV, about 0.1 eV to about 1.3 eV, about 0.2 eV to about 1.3 eV, about 0.5 eV to about 1.3 eV, or the like, respectively.

The insertion layer 360 may have a very thin thickness (where the thickness may be in a vertical direction that is perpendicular to the in-plane direction of the substrate 110, for example the Z-axis direction), for example, a thickness of less than or equal to about 12 nm, within the range, less than or equal to about 11 nm, or less than or equal to about 10 nm, within the range, about 0.5 nm to about 12 nm, about 0.5 nm to about 11 nm, about 0.5 nm to about 10 nm, about 0.5 nm to about 9 nm, 0.5 nm to about 8 nm, about 0.5 nm to about 5 nm, 0.5 nm to about 3 nm, about 1 nm to about 12 nm, about 1 nm to about 11 nm, about 1 nm to about 10 nm, about 1 nm to about 9 nm, about 1 nm to about 8 nm, about 1 nm to about 5 nm, or about 1 nm to about 3 nm. When the insertion layer 360 has a thickness within the ranges, the electron transfer and/or extraction exhibited by the sensor 300 may be effectively increased, while reducing, minimizing, or preventing a decrease in light transmittance, thereby improving the functionality (e.g., light sensing functionality, image generating functionality, power consumption efficiency, etc.) of the sensor 300.

In some example embodiments, the insertion layer 360 may be formed by depositing (e.g., thermally depositing) the above metal and/or metal compound, wherein as the metal and/or metal compound is formed into a very thin thickness, the metal and/or metal compound in the insertion layer 360 may be for example present in the form of aggregations. Accordingly, the upper surface 360*u* of the insertion layer 360, that is, the surface facing the second common auxiliary layer 340 may not have a flat surface (e.g., a planar surface) but instead may have an uneven surface (e.g., a non-planar surface). The uneven surface of the insertion layer 360 may effectively condense light reflected by the recognition target 40 and introduced through the common electrode 320 and the second common auxiliary layer 340 (e.g., incident light) and then, transfer it (the condensed light) to the photosensitive layer 330 to increase light absorption efficiency of the sensor 300, ultimately improving electrical performance and thus improving functionality (e.g., light sensing functionality, image generating functionality, power consumption efficiency, etc.) of the sensor 300.

The insertion layer 360, unlike the first and second common auxiliary layers 350 and 340, may be selectively included only in the sensor 300, but not in the first, second, and third light emitting elements 210, 220, and 230 (e.g., the insertion layer 360 may not be included in any of the first, second, and third light emitting elements 210, 220, and 230; the insertion layer 360 may be excluded from the first, second, and third light emitting elements 210, 220, and 230, etc.), for example such that the insertion layer 360 does not overlap any of the light emitting layers 212, 222, or 232 in the vertical direction extending perpendicular to the in-plane direction of the substrate 110, for example such that the insertion layer 360 does not overlap any of the respective pixel electrodes 211, 221, and 231 of any of the first, second, and third light emitting elements 210, 220, and 230 in the vertical direction extending perpendicular to the in-plane direction of the substrate 110 (e.g., the Z-axis direction), or any combination thereof.

As described above, the sensor 300 includes an n-type semiconductor (e.g., a non-fullerene n-type semiconductor) having a relatively deep LUMO energy level in the second semiconductor layer 330*q* to increase charge separation efficiency from excitons and simultaneously, includes the insertion layer 360 between the second semiconductor layer 330*q* and the second common auxiliary layer 340 to increase light absorption efficiency and simultaneously, to prevent deterioration of electron transfer and/or extraction efficiency to the second common auxiliary layer 340. Accordingly, the sensor 300 may simultaneously satisfy the charge separation efficiency and the electron transport and/or extraction efficiency, which are in a trade-off relationship, and thus may improve the functionality (e.g., image sensing functionality, image generating functionality, power consumption efficiency, etc.) of the sensor 300 and any device including same (e.g., the sensor-embedded display panel 1000).

On the first, second and third light emitting elements 210, 220, and 230 and the sensor 300, the encapsulation layer 50 is formed. The encapsulation layer 50 may include, for example, a glass plate, a metal thin film, an organic layer, an inorganic layer, an organic/inorganic layer, or any combination thereof. The organic layer may include, for example, an acrylic resin, a (meth)acrylic resin, polyisoprene, a vinyl resin, an epoxy resin, a urethane resin, a cellulose resin, a perylene resin, or any combination thereof, but is not limited thereto. The inorganic layer may include, for example, oxide, nitride, and/or oxynitride, for example, silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or any combination thereof, but is not limited thereto. The organic/inorganic layer may include, for example, polyorganosiloxane, but is not limited thereto. The encapsulation layer 50 may have one layer or two or more layers.

As described above, the sensor-embedded display panel 1000 according to some example embodiments includes the first, second, and third light emitting elements 210, 220, and 230 configured to emit light in a particular (or, alternatively, predetermined) wavelength spectrum to display colors, and the sensor 300 configured to absorb light reflected by the recognition target 40 and convert it (the absorbed light) into an electrical signal, in the same plane on the substrate 110, thereby performing a display function and a recognition function (e.g., biometric recognition function). Accordingly, unlike conventional display panels formed outside the display panel or formed under the display panel by manufacturing the sensor as a separate module, it may improve performance without increasing the thickness, implementing a slim-type high performance sensor-embedded display panel 1000.

In addition, since the sensor 300 uses light emitted from the first, second, and third light emitting elements 210, 220, and 230, a recognition function (e.g., biometric recognition function) may be performed without a separate light source. Therefore, it is not necessary to provide a separate light source outside the display panel, thereby reducing, minimizing, or preventing a decrease in the aperture ratio of the display panel due to the area occupied by the light source, and at the same time saving power consumed by the separate light source to improve power consumption by the sensor-embedded display panel 1000 and any device including same.

In addition, since the sensor 300 may be disposed anywhere in the non-display area NDA, they may be disposed at a desired location of the sensor-embedded display panel 1000 as many as desired. Therefore, for example, by randomly or regularly arranging the sensor 300 over the entire sensor-embedded display panel 1000, the biometric recognition function may be performed on any portion of the screen of an electronic device such as a mobile device and the biometric recognition function may be selectively performed only in a specific location where the biometric recognition function is required.

In addition, as described above, the first, second, and third light emitting elements 210, 220, and 230 and the sensor 300 share the common electrode 320, the first common auxiliary layer 350, and the second common auxiliary layer 340 and thus the structure and process may be simplified compared with the case where the first, second, and third light emitting elements 210, 220, and 230 and the sensor 300 are formed in separate processes, thereby enabling the sensor-embedded display panel 1000 to be manufactured with reduced manufacturing costs and/or process complexity (which thereby reduces the likelihood of manufacturing process defects in the sensor-embedded display panel 1000 and thus improves the reliability of the manufactured sensor-embedded display panel 1000).

In addition, as described above, the sensor 300 may include the n-type semiconductor having a relatively deep LUMO energy level in the second semiconductor layer 330*q* to increase charge separation efficiency from excitons by and simultaneously, include the insertion layer 360 between the second semiconductor layer 330*q* and the second common auxiliary layer 340 to increase light absorption efficiency and simultaneously to reduce, minimize, or prevent deterioration of electron transfer and/or extraction efficiency to the second common auxiliary layer 340. Accordingly, the sensor 300 may simultaneously satisfy the charge separation efficiency and the electron transport and/or extraction efficiency, which are in a trade-off relationship thus may exhibit improved functionality (e.g., image sensing functionality, image generating functionality, power consumption efficiency, etc.) based on including the insertion layer 360.

In addition, as described above, the organic light emitting material included in the light emitting layers 212, 222, and 232 of the first, second, and third light emitting elements 210, 220, and 230 and the p-type and n-type semiconductors included in the photosensitive layer 330 of the sensor 300 have a sublimation temperature within the particular (or, alternatively, predetermined) ranges and may be deposited in a continuous process in the same chamber. Accordingly, the first, second, and third light emitting elements 210, 220, and 230 and the sensor 300 may be manufactured in one process and thus realize a display panel conducting both a display function and a recognition function (e.g., a biometric recognition function) without a substantial additional process, thereby enabling the sensor-embedded display panel 1000 to be manufactured with reduced manufacturing costs and/or process complexity (which thereby reduces the likelihood of manufacturing process defects in the sensor-embedded display panel 1000 and thus improves the reliability of the manufactured sensor-embedded display panel 1000).

In addition, the sensor 300 may be an organic sensor including an organic photosensitive layer and have more than twice light absorption, compared with an inorganic diode such as a silicon photodiode, and thus a higher sensing function with a thinner thickness.

The aforementioned sensor-embedded display panel 1000 may be applied to electronic devices such as various display devices. Electronic devices such as display devices may be applied to, for example, mobile phones, video phones, smart phones, mobile phones, smart pads, smart watches, digital cameras, tablet PCs, laptop PCs, notebook computers, computer monitors, wearable computers, televisions, digital broadcasting terminals, e-books, personal digital assistants (PDAs), portable multimedia player (PMP), enterprise digital assistant (EDA), head mounted display (HMD), vehicle navigation, Internet of Things (IoT), Internet of all things (IoE), drones, door locks, safes, automatic teller machines (ATM), security devices, medical devices, or automotive electronic components, but are not limited thereto.

Figure 3:
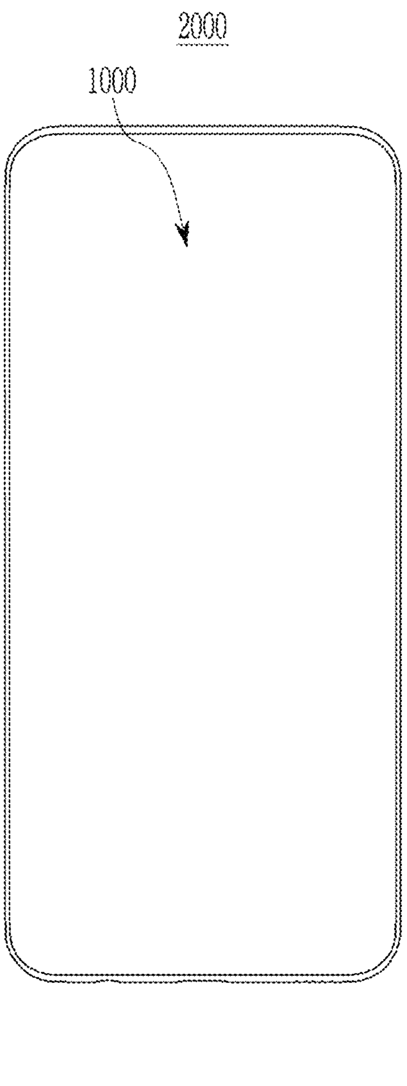
FIG. 3 is a schematic view illustrating an example of a smart phone as an electronic device according to some example embodiments.

FIG. 3 is a schematic view illustrating an example of a smart phone as an electronic device according to some example embodiments.

Referring to FIG. 3, the electronic device 2000 according to some example embodiments may include the aforementioned sensor-embedded display panel 1000, the sensor-embedded display panel 1000 having the sensor 300 on the whole or a portion of the area of the sensor-embedded display panel 1000, and thus a biometric recognition function may be performed on any portion of the screen, and according to the user's selection, the biometric recognition function may be selectively performed only at a specific location where the biometric recognition function is required.

An example of a method of recognizing the recognition target 40 in an electronic device 2000 such as a display device may include, for example, driving the first, second, and third light emitting elements 210, 220, and 230 of the sensor-embedded display panel 1000 and the sensor 300 to detect the light reflected from the recognition target 40 among the light emitted from the first, second, and third light emitting elements 210, 220, and 230, in the sensor 300; comparing the image of the recognition target 40 stored in advance with the image of the recognition target 40 detected by the sensor 300; and judging the consistency of the compared images and if they match according to the determination that recognition of the recognition target 40 is complete, turning off the sensor 300, permitting user's access to the display device, and driving the sensor-embedded display panel 1000 to display an image.

Figure 4:
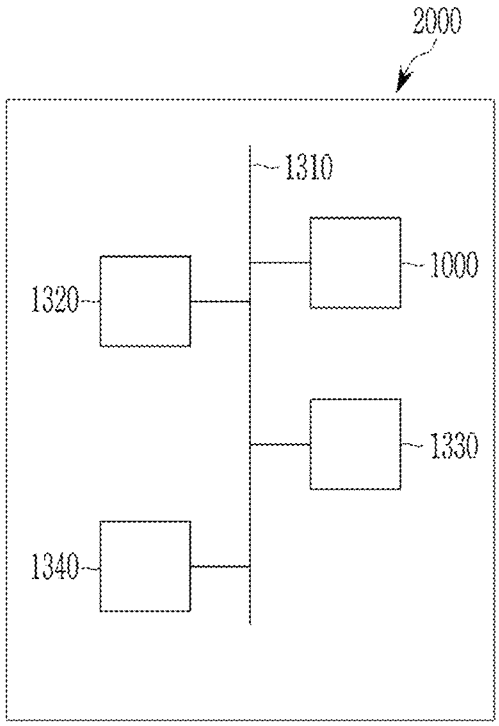
FIG. 4 is a schematic view illustrating an example of a configuration diagram of an electronic device according to some example embodiments.

FIG. 4 is a schematic view illustrating an example of a configuration view of an electronic device according to some example embodiments.

Referring to FIG. 4, in addition to the aforementioned constituent elements (e.g., the sensor-embedded display panel 1000), the electronic device 2000 may further include a bus 1310, a processor 1320, a memory 1330, and at least one additional device 1340. Information of the aforementioned sensor-embedded display panel 1000, processor 1320, memory 1330, and at least one additional device 1340 may be transmitted to each other through the bus 1310.

The processor 1320 may include one or more articles (e.g., units, instances, etc.) of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. As an example, the processing circuitry may include a non-transitory computer readable storage device. The processor 1320 may, for example, control a display operation of the sensor-embedded display panel 1000 or control a sensor operation of the sensor 300.

The memory 1330 may be a non-transitory computer readable storage medium, such as, for example, as a solid state drive (SSD) and may store an instruction program (e.g., program of instructions), and the processor 1320 may perform a function related to the sensor-embedded display panel 1000 by executing the stored instruction program.

The at least one additional device 1340 may be one or more communication interfaces (e.g., wireless communication interfaces, wired interfaces), user interfaces (e.g., keyboard, mouse, buttons, etc.), power supply and/or power supply interfaces, or any combination thereof.

The units and/or modules described herein may be implemented using hardware constituent elements and software constituent elements. The units and/or modules described herein may include, may be included in, and/or may be implemented by one or more articles of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. For example, the hardware constituent elements may include microphones, amplifiers, band pass filters, audio-to-digital converters, and processing devices. The processing device may be implemented using one or more hardware devices configured to perform and/or execute program code by performing arithmetic, logic, and input/output operations. The processing device may include a processor, a controller and an arithmetic logic unit, a digital signal processor, a microcomputer, a field programmable array, a programmable logic unit, a microprocessor, or any other device capable of responding to and executing instructions. The processing device may access, store, operate, process, and generate data in response to execution of an operating system (OS) and one or more software running on the operating system.

The software may include a computer program, a code, an instruction, or any combination thereof, and may transform a processing device for a special purpose by instructing and/or configuring the processing device independently or collectively to operate as desired. The software and data may be implemented permanently or temporarily as signal waves capable of providing or interpreting instructions or data to machines, parts, physical or virtual equipment, computer storage media or devices, or processing devices. The software may also be distributed over networked computer systems so that the software may be stored and executed in a distributed manner. The software and data may be stored by one or more non-transitory computer readable storage devices.

The method according to any of the example embodiments may be recorded in a non-transitory computer readable storage device including program instructions for implementing various operations of the aforementioned embodiments. The storage device may also include program instructions, data files, data structures, and the like alone or in combination. The program instructions recorded in the storage device may be specially designed for some example embodiments or may be known to those skilled in computer software and available for use. Examples of non-transitory computer-readable storage devices may include magnetic media such as hard disks, floppy disks, and magnetic tapes; optical media such as CD-ROM discs, DVDs and/or blue-ray discs; magneto-optical media such as optical disks; and a hardware device configured to store and execute program instructions such as ROM, RAM, flash memory, and the like. The aforementioned device may be configured to operate as one or more software modules to perform the operations of the aforementioned embodiments.

Hereinafter, some example embodiments are illustrated in more detail with reference to examples. However, the scope of the inventive concepts is not limited to such examples.

Example: Manufacture of Sensors

Example 1-1

Al (10 nm), ITO (100 nm), and Al (8 nm) are sequentially deposited on the glass substrate to form a lower electrode (work function: 4.9 eV) of an Al/ITO/Al structure. Subsequently, N,N'-bis(3-methylphenyl)-N,N'-diphenyl-[1,1-biphenyl]-4,4'-diamine is deposited on the lower electrode to form a hole auxiliary layer (HOMO: 5.3 eV to 5.6 eV, LUMO: 2.0 eV to 2.3 eV). On the hole auxiliary layer, Compound A (p-type semiconductor) having properties shown in Table 1 is deposited to form a 10 nm-thick p-type semiconductor layer. On the p-type semiconductor layer, Compound B (n-type semiconductor, e.g., a non-fullerene n-type semiconductor) having properties shown in Table 1 is deposited to form a 40 nm-thick n-type semiconductor layer, resultantly forming a bi-layered photosensitive layer. Then, ytterbium (Yb) is deposited on the photosensitive layer at a rate of 1.0 Å/s by vacuum thermal deposition to form a 1 nm-thick insertion layer (work function: 3.08 eV), and 4,7-diphenyl-1,10-phenanthroline is deposited thereon to form an electron auxiliary layer (HOMO: 6.1 to 6.4 eV, LUMO: 2.9 to 3.1 eV). Then, magnesium and silver are deposited on the electronic auxiliary layer to form an Mg:Ag upper electrode to manufacture a sensor.

TABLE 1

| | p-type semiconductor Compound A | n-type semiconductor Compound B |
|---|---|---|
| Molecular weight (g/mol) | 488.41 | 486.02 |
| HOMO (eV) | 5.61 | 6.19 |
| LUMO (eV) | 3.52 | 3.23 |
| Eg (eV) | 2.09 | 2.96 |
| $\lambda_{max}$ (nm) | 541 | — |
| $T_{s(10)}$ (° C.) | 253 | 270 |
| Refractive Index, n | 2.29 | 1.65 |
| Extinction Coefficient, k | 0.94 | 0.00 |

* Eg: energy bandgap

* $T_{s(10)}$: a temperature at which the weight of the sample decreases by 10% relative to the initial weight

* λmax: maximum absorption wavelength

Example 1-2

A sensor is manufactured in the same manner as in Example 1-1, except that ytterbium (Yb) is subjected to vacuum thermal deposition to form a 5 nm-thick insertion layer.

Example 1-3

A sensor is manufactured in the same manner as in Example 1-1, except that ytterbium (Yb) is subjected to vacuum thermal deposition to form a 10 nm-thick insertion layer.

Example 2-1

A sensor is manufactured in the same manner as in Example 1-1, except that aluminum (Al) is deposited instead of ytterbium (Yb) to form a 1 nm-thick insertion layer (work function: 4.00 eV).

Example 2-2

A sensor is manufactured in the same manner as in Example 2-1, except that aluminum (Al) is deposited to form a 5 nm-thick insertion layer.

Comparative Example 1

A sensor is manufactured in the same manner as in Example 1-1 except that the insertion layer is not formed.

Comparative Example 2-1

A sensor is manufactured in the same manner as in Example 1-1, except that a 1 nm-thick insertion layer (work function: 4.68 eV) is formed by vacuum thermal deposition of silver (Ag) instead of ytterbium (Yb).

Comparative Example 2-2

A sensor is manufactured in the same manner as in Comparative Example 2-1, except that silver (Ag) is subjected to vacuum thermal deposition to form a 5 nm-thick insertion layer.

Comparative Example 2-3

A sensor is manufactured in the same manner as in Comparative Example 2-1, except that silver (Ag) is subjected to vacuum thermal deposition to form a 10 nm-thick insertion layer.

Evaluation

Electrical characteristics of the sensors according to Examples are evaluated.

The electrical characteristics are evaluated from external quantum efficiency (EQE). The external quantum efficiency (EQE) is evaluated from the external quantum efficiency (EQE) at a wavelength of 530 nm after being left at 85° C. for 1 hour, and is evaluate by incident photon to current efficiency (IPCE) equipment at 530 nm wavelength at −3 V.

The results are shown in Table 2.

TABLE 2

| | $EQE_{max}$ (%, @−3 V, 530 nm) |
|---|---|
| Example 1-1 | 44.4 |
| Example 1-2 | 39.7 |
| Example 1-3 | 20.9 |
| Example 2-1 | 44.9 |
| Example 2-2 | 9.3 |
| Comparative Example 1 | 2.7 |
| Comparative Example 2-1 | 2.1 |
| Comparative Example 2-2 | 1.2 |
| Comparative Example 2-3 | 1.3 |

Referring to Table 2, the sensors according to Examples 1-1 to 2-2 exhibit improved photoelectric conversion efficiency compared to the sensors according to Comparative Examples 1 to 2-3.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. A sensor-embedded display panel, comprising:

a light emitting element on a substrate, the light emitting element including a light emitting layer, and a sensor on the substrate, the sensor including a photosensitive layer arranged in parallel with the light emitting layer along an in-plane direction of the substrate, wherein the light emitting element and the sensor include separate, respective portions of a first common auxiliary layer connected to each other to extend continuously under the light emitting layer and the photosensitive layer, the first common auxiliary layer including a hole transport material, and separate, respective portions of a second common auxiliary layer connected to each other to extend continuously on the light emitting layer and the photosensitive layer, the second common auxiliary layer including an electron transport material, wherein the photosensitive layer includes a first semiconductor layer that is proximate to the first common auxiliary layer in relation to the second common auxiliary layer and includes a p-type semiconductor, and a second semiconductor layer that is proximate to the second common auxiliary layer in relation to the first common auxiliary layer and includes a non-fullerene n-type semiconductor, a lowest unoccupied molecular orbital (LUMO) energy level of the non-fullerene n-type semiconductor being deeper than a LUMO energy level of the electron transport material, wherein the sensor further includes an insertion layer between the second semiconductor layer and the second common auxiliary layer, the insertion layer includes a metal, a metal compound, or any combination thereof, and a work function of the metal or a LUMO energy level of the metal compound is deeper or shallower than each of the LUMO energy level of the non-fullerene n-type semiconductor and the LUMO energy level of the electron transport material within less than about 1.3 eV, respectively.

2. The sensor-embedded display panel of claim 1, wherein a thickness of the insertion layer is about 0.5 nm to about 12 nm.

3. The sensor-embedded display panel of claim 1, wherein the work function of the metal or the LUMO energy level of the metal compound is about 2.8 eV to about 4.2 eV.

4. The sensor-embedded display panel of claim 1, wherein the metal comprises lanthanides, aluminum (Al), calcium (Ca), potassium (K), magnesium (Mg), an alloy thereof, or any combination thereof, and the metal compound comprises an oxide or a sulfide containing at least one of titanium (Ti), tin (Sn), magnesium (Mg), zinc (Zn), or zirconium (Zr).

5. The sensor-embedded display panel of claim 1, wherein an upper surface of the insertion layer facing the second common auxiliary layer has an uneven surface.

6. The sensor-embedded display panel of claim 1, wherein the LUMO energy level of the non-fullerene n-type semiconductor is deeper than the LUMO energy level of the electron transport material within greater than or equal to about 0.01 eV and less than or equal to about 1.0 eV.

7. The sensor-embedded display panel of claim 6, wherein the LUMO energy level of the non-fullerene n-type semiconductor is greater than about 2.9 eV and less than or equal to about 3.8 eV, and an energy bandgap of the non-fullerene n-type semiconductor is about 2.5 eV to about 4.0 eV.

8. The sensor-embedded display panel of claim 6, wherein the LUMO energy level of the non-fullerene n-type semiconductor is greater than about 2.9 eV and less than or equal to about 3.8 eV, and the LUMO energy level of the electron transport material is about 2.9 eV to about 3.3 eV.

9. The sensor-embedded display panel of claim 1, wherein the LUMO energy level of the non-fullerene n-type semiconductor is about 3.0 eV to about 3.5 eV, the work function of the metal or the LUMO energy level of the metal compound is about 2.9 eV to about 4.0 eV, and the LUMO energy level of the electron transport material is between about 2.9 eV to about 3.2 eV.

10. The sensor-embedded display panel of claim 1, wherein the second common auxiliary layer is included in both the light emitting element and the sensor, and the insertion layer is only included in the sensor and is not included in the light emitting element.

11. The sensor-embedded display panel of claim 1, wherein the light emitting layer comprises at least one organic light emitting material, and a LUMO energy level of the at least one organic light emitting material is shallower than the LUMO energy level of the electron transport material.

12. The sensor-embedded display panel of claim 11, wherein a difference in sublimation temperatures among the p-type semiconductor, the non-fullerene n-type semiconductor, and the at least one organic light emitting material is greater than or equal to about 0° C. and less than about 150° C., and for each material of the p-type semiconductor, the non-fullerene n-type semiconductor, and the at least one organic light emitting material, a sublimation temperature of the each material is a temperature at which a weight loss of 10% of the each material compared to an initial weight of the each material occurs during thermogravimetric analysis of the each material at 10 Pa or less.

13. The sensor-embedded display panel of claim 1, wherein the light emitting element and the sensor further comprise a common electrode on the second common auxiliary layer, the common electrode configured to apply a common voltage to both the light emitting element and the sensor.

14. The sensor-embedded display panel of claim 1, wherein the light emitting element comprises a first light emitting element configured to emit light of a red wavelength spectrum, a second light emitting element configured to emit light of a green wavelength spectrum, and a third light emitting element configured to emit light of a blue emission spectrum, the sensor is between at least two of the first light emitting element, the second light emitting element, or the third light emitting element, and the sensor is configured to convert absorbed light into an electrical signal, the absorbed light emitted from at least one of the first light emitting element, the second light emitting element, or the third light emitting element, reflected by a recognition target, and absorbed by the sensor.

15. The sensor-embedded display panel of claim 1, wherein the p-type semiconductor is an organic light absorbing semiconductor configured to absorb light in a portion of a visible light wavelength spectrum, and the non-fullerene n-type semiconductor is a transparent organic semiconductor.

16. An electronic device comprising the sensor-embedded display panel of claim 1.

17. A sensor-embedded display panel, comprising:

a display area configured to display a color, and a non-display area other than the display area, wherein the display area includes a first subpixel configured to display a first color and including a first light emitting element, a second subpixel configured to display a second color and including a second light emitting element, and a third subpixel configured to display a third color and including a third light emitting element, wherein the non-display area includes a sensor between at least two of the first subpixel, the second subpixel, or the third subpixel, wherein the sensor includes a first electrode, a first common auxiliary layer on the first electrode, the first common auxiliary layer including a hole transport material, a first semiconductor layer on the first common auxiliary layer, the first semiconductor layer including a p-type semiconductor, a second semiconductor layer on the first semiconductor layer, the second semiconductor layer including a non-fullerene n-type semiconductor, an insertion layer on the second semiconductor layer, the insertion layer including a metal, a metal compound, or any combination thereof, a second common auxiliary layer on the insertion layer, the second common auxiliary layer including an electron transport material, and a second electrode, and wherein a work function of the metal or a lowest unoccupied molecular orbital (LUMO) energy level of the metal compound is deeper or shallower than each of a LUMO energy level of the non-fullerene n-type semiconductor and a LUMO energy level of the electron transport material within less than about 1.3 eV, respectively.

18. The sensor-embedded display panel of claim 17, wherein a thickness of the insertion layer is about 0.5 nm to about 12 nm, and the work function of the metal or the LUMO energy level of the metal compound are about 2.8 eV to about 4.2 eV.

19. The sensor-embedded display panel of claim 17, wherein the metal comprises lanthanides, aluminum (Al), calcium (Ca), potassium (K), magnesium (Mg), an alloy thereof, or any combination thereof, and the metal compound comprises an oxide or a sulfide containing at least one of titanium (Ti), tin (Sn), magnesium (Mg), zinc (Zn), or zirconium (Zr).

20. The sensor-embedded display panel of claim 17, wherein the p-type semiconductor is an organic light absorbing semiconductor configured to absorb light of a wavelength spectrum corresponding to any one of the first color, the second color, or the third color, and the non-fullerene n-type semiconductor is a transparent organic semiconductor having a LUMO energy level of greater than about 2.9 eV and less than or equal to about 3.8 eV.

* * * * *